(12) United States Patent
Inoue

(10) Patent No.: US 12,525,510 B2
(45) Date of Patent: Jan. 13, 2026

(54) SEMICONDUCTOR DEVICE, PACKAGE FOR SEMICONDUCTOR DEVICE, AND METHOD FOR MANUFACTURING PACKAGE FOR SEMICONDUCTOR DEVICE

(71) Applicant: Sumitomo Electric Device Innovations, Inc., Yokohama (JP)

(72) Inventor: Shingo Inoue, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 624 days.

(21) Appl. No.: 17/952,855

(22) Filed: Sep. 26, 2022

(65) Prior Publication Data
US 2023/0097270 A1 Mar. 30, 2023

(30) Foreign Application Priority Data
Sep. 28, 2021 (JP) .................. 2021-157501

(51) Int. Cl.
*H01L 23/492* (2006.01)
*H01L 21/48* (2006.01)
(Continued)

(52) U.S. Cl.
CPC ........ *H01L 23/492* (2013.01); *H01L 21/4875* (2013.01); *H01L 23/49822* (2013.01);
(Continued)

(58) Field of Classification Search
CPC ......... H01L 23/492–4928; H01L 23/36; H01L 23/373; H01L 23/3736; H01L 23/66; H01L 23/642; H01L 23/64; H01L 23/49822; H01L 23/49833; H01L 23/49527; H01L 23/49534; H01L 23/047; H01L 23/49838; H01L 23/49844; H01L 23/49866; H01L 23/49894; H01L 23/10; H01L 23/49541; H01L 23/562; H01L 24/42;
(Continued)

(56) References Cited

U.S. PATENT DOCUMENTS 5,025,114 A * 6/1991 Braden ................... H01L 24/49
257/E23.035
9,484,222 B2 11/2016 Ladhani et al.
(Continued)

FOREIGN PATENT DOCUMENTS

JP 58-099841 U 7/1983

*Primary Examiner* — Zandra V Smith
*Assistant Examiner* — Douglas Yap
(74) *Attorney, Agent, or Firm* — Volpe Koenig

(57) ABSTRACT

A package for a semiconductor device includes a metal base plate, a wall portion, a first metal film, and a lead portion. The base plate has a first region and a second region surrounding the first region. The wall portion has a first frame body comprising metal and a second frame body comprising resin. The first frame body is provided on the second region. The second frame body is provided on the first frame body. The first metal film is provided on the second frame body. The lead portion is conductively bonded to the first metal film. The first frame body is conductively bonded to the base plate. A thickness of the first frame body in a first direction that is a direction in which the first frame body and the second frame body are arranged is larger than a thickness of the first metal film in the first direction.

8 Claims, 29 Drawing Sheets

(51) Int. Cl.
*H01L 23/00* (2006.01)
*H01L 23/498* (2006.01)
*H01L 23/64* (2006.01)

(52) U.S. Cl.
CPC ........ H01L 23/49866 (2013.01); H01L 24/48 (2013.01); *H01L 23/642* (2013.01); *H01L 2224/05139* (2013.01); *H01L 2224/48175* (2013.01)

(58) Field of Classification Search
CPC ............. H01L 21/4871; H01L 21/4875; H01L 2224/05139; H01L 23/49827; H01L 21/4857; H01L 21/486; H01Q 1/2283; H01Q 21/06; H01Q 21/0087; H01Q 21/065; H01Q 9/0414; H01Q 9/0407
See application file for complete search history.

(56) References Cited

U.S. PATENT DOCUMENTS

| | | | | |
|---|---|---|---|---|
| 2014/0252569 | A1* | 9/2014 | Ikuma | H01L 23/10 257/659 |
| 2019/0279923 | A1* | 9/2019 | Nagata | H01L 23/142 |
| 2021/0202372 | A1* | 7/2021 | Kato | H01L 25/18 |
| 2022/0359322 | A1* | 11/2022 | Hung | H01L 23/16 |

* cited by examiner

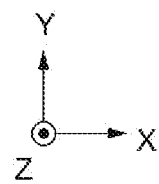
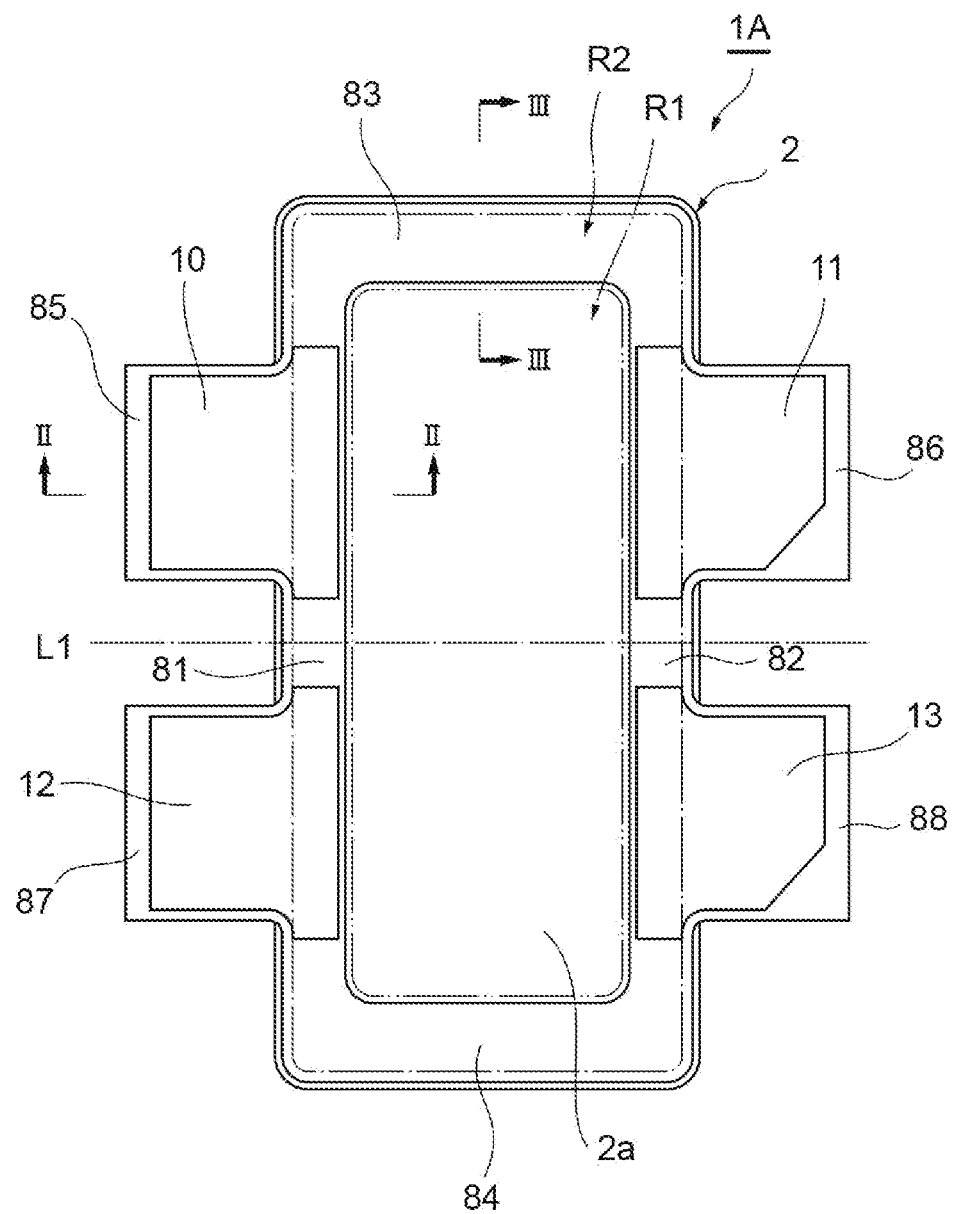

Fig.7
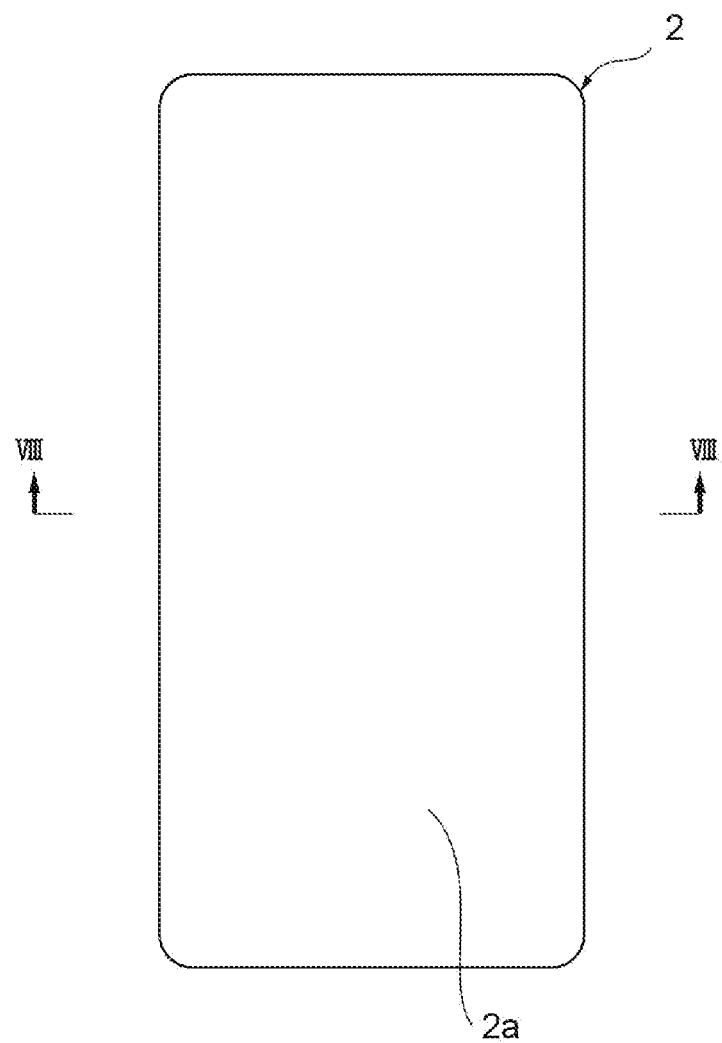
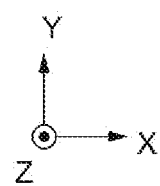

Fig.9
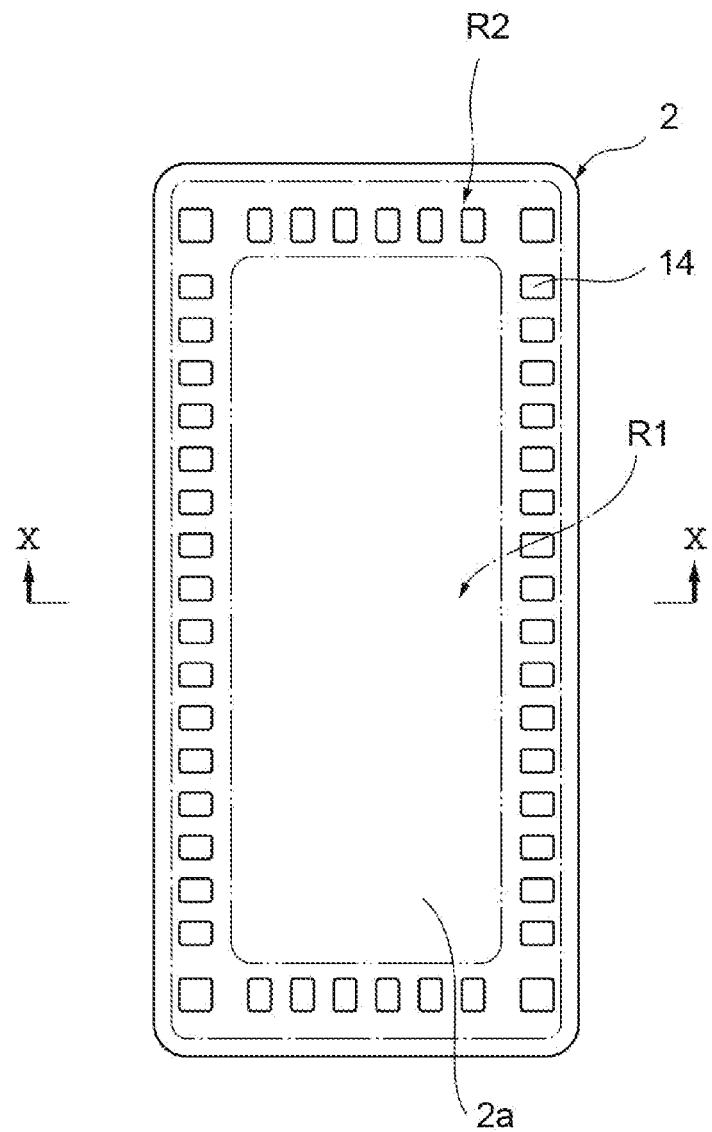
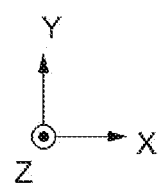

SEMICONDUCTOR DEVICE, PACKAGE FOR SEMICONDUCTOR DEVICE, AND METHOD FOR MANUFACTURING PACKAGE FOR SEMICONDUCTOR DEVICE

CROSS-REFERENCE TO RELATED APPLICATIONS

This application claims priority based on Japanese Patent Application No. 2021-157501, filed on Sep. 28, 2021, the entire contents of which are incorporated herein by reference.

TECHNICAL FIELD

The present disclosure relates to a semiconductor device, a package for a semiconductor device, and a method for manufacturing a package for a semiconductor device.

BACKGROUND

Patent Document 1 (Japanese Unexamined Utility Model Publication No. S58-99841) discloses a constitution of a package for a semiconductor device. This package for a semiconductor device has a metal base body, an insulation substrate, a metallized layer, and an insulator frame. The insulation substrate is formed on the metal base body. The metallized layer is formed on a surface of the insulation substrate. An electrode of a semiconductor element is connected to one end of the metallized layer. An external connection terminal is firmly attached to the other end of the metallized layer. The insulator frame is installed on the insulation substrate and surrounds the semiconductor element.

SUMMARY

A package for a semiconductor device of the present disclosure includes a base plate, a wall portion, a first metal film, and a lead portion. The base plate has a first region and a second region surrounding the first region. The base plate comprises a metal. The wall portion has a first frame body and a second frame body. The first frame body is provided on the second region. The second frame body is provided on the first frame body. The first frame body comprises a metal. The second frame body comprises a resin. The first metal film is provided on the second frame body. The lead portion is conductively bonded to the first metal film. The first frame body is conductively bonded to the base plate. A thickness of the first frame body in a first direction that is a direction in which the first frame body and the second frame body are arranged is larger than a thickness of the first metal film in the first direction.

A method for manufacturing a package for a semiconductor device according to the present disclosure includes a first step and a second step. In the first step, a metal base plate has a first region and a second region surrounding the first region. In the first step, a first frame body comprising a metal has a bottom surface and a top surface facing opposite to the bottom surface. In the first step, the bottom surface of the first frame body is conductively bonded to the second region of the base plate. In the second step, a second frame body comprising a resin has a bottom surface and a top surface facing opposite to the bottom surface. In the second step, a first metal film is formed on the top surface of the second frame body. In the second step, a lead portion is conductively bonded to the first metal film. The bottom surface of the second frame body is bonded to the top surface of the first frame body. A first direction is a direction in which the first frame body and the second frame body are arranged. A thickness of the first frame body in the first direction is larger than a thickness of the first metal film in the first direction.

BRIEF DESCRIPTION OF THE DRAWINGS

FIG. 1 is a plan view of a package for a semiconductor device according to an embodiment.

FIG. 7 is a plan view illustrating a step in a method for manufacturing a package and a semiconductor device.

FIG. 9 is a plan view illustrating a step in the method for manufacturing a package and a semiconductor device.

DETAILED DESCRIPTION

Figure 2:
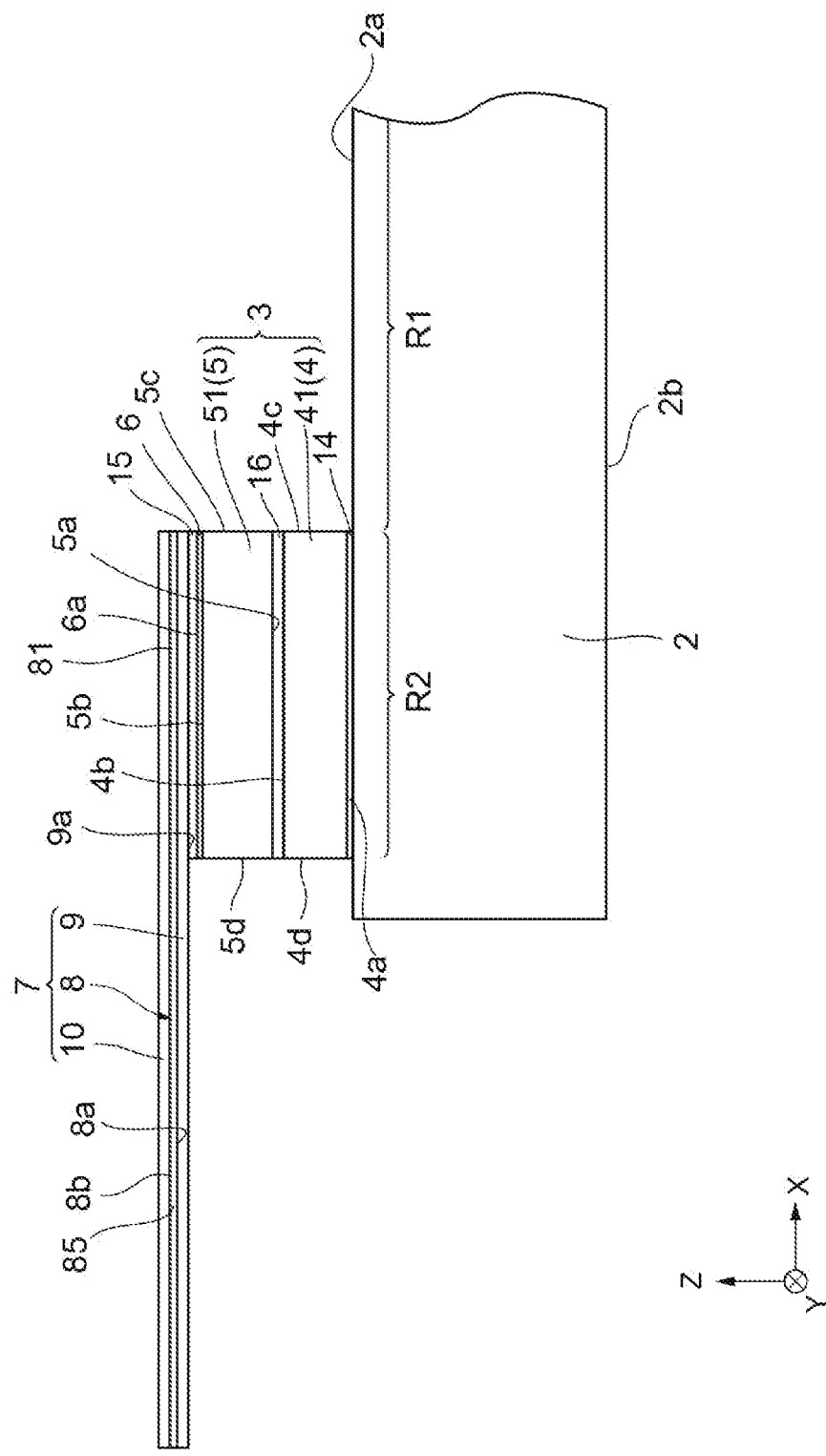
FIG. 2 is a view schematically illustrating a cross section along line II-II in FIG. 1.

Problems to be Solved by the Present Disclosure

In a package for a semiconductor device described in Patent Document 1, an insulation wall portion is provided on a metal base plate. Further, an external connection terminal is provided on the wall portion. The external connection terminal is connected to an electrode of a semiconductor element. A microstrip line having the base plate as a ground potential and the external connection terminal as a signal line is constituted with the insulation wall portion sandwiched therebetween.

In a semiconductor device having a high frequency and a high output, the insulation wall portion is formed of a ceramic, for example. Meanwhile, in place of a ceramic, it is conceivable that the insulation wall portion be formed of a resin, for example. Generally, the dielectric constant of a resin is lower than the dielectric constant of a ceramic. Hence, in order to secure a capacitance suitable for impedance matching between the external connection terminal and the base plate, it is conceivable that the thickness of the resin wall portion be reduced compared to a case in which the insulation wall portion is made of a ceramic. However, when it is not allowed to change the height from a rear surface of the base plate to the external connection terminal on a wall portion upper surface, the thickness of the base plate increases by the amount corresponding to the reduced thickness of the wall portion. In that case, it is more difficult to perform working of the base plate.

Effects of the Present Disclosure

According to the present disclosure, it is possible to provide a package for a semiconductor device which has a wall portion containing a resin and in which impedance matching can be favorably performed while allowing excellent workability of a base plate.

DESCRIPTION OF EMBODIMENT OF PRESENT DISCLOSURE

A package for a semiconductor device according to an embodiment includes a base plate, a wall portion, a first metal film, and a lead portion. The base plate has a first region and a second region surrounding the first region. The base plate comprises a metal. The wall portion has a first frame body and a second frame body. The first frame body is provided on the second region. The second frame body is provided on the first frame body. The first frame body comprises a metal. The second frame body comprises a resin. The first metal film is provided on the second frame body. The lead portion is conductively bonded to the first metal film. The first frame body is conductively bonded to the base plate. The thickness of the first frame body in a first direction that is a direction in which the first frame body and the second frame body are arranged is larger than the thickness of the first metal film in the first direction.

In this package for a semiconductor device, the wall portion having the first frame body comprising a metal and the second frame body comprising a resin is provided on the base plate comprising a metal. The lead portion is provided on a upper surface of the wall portion. Accordingly, a microstrip line having the first frame body as a ground potential and the lead portion as a signal line may be constituted. Further, the thickness of the second frame body comprising a resin can be reduced while the thickness of the wall portion is maintained, because of increasing the thickness of the first frame body comprising a metal. Accordingly, a capacitance suitable for impedance matching can be secured while the height from the rear surface of the base plate to the lead portion of the wall portion upper surface is maintained. Therefore, according to this package for a semiconductor device, there is no need to increase the thickness of the base plate when the wall portion containing a resin is used, and thus excellent workability of the base plate can be maintained. The distance between a top surface of the first frame body and the lead portion is shortened so that impedance matching can be favorably performed.

When a ceramic having a high dielectric constant is used for an insulation part of the microstrip line, the electrical length in the insulation part is lengthened, and phase rotation increases. In contrast, in the foregoing package for a semiconductor device, the insulation part of the microstrip line, that is, the second frame body is made of a resin having a lower dielectric constant than a ceramic. Therefore, the electrical length in the insulation part is shortened and phase rotation decreases, and thus it is possible to come close to ideal matching.

The thickness of the first frame body in the first direction may be 100 μm or more and 500 μm or less. When the thickness of the first frame body is 100 μm or longer, the first frame body has a sufficient strength so that the shape of the first frame body is more reliably retained when the package is assembled. Moreover, a capacitance suitable for impedance matching can be secured by sufficiently reducing the thickness of the second frame body. When the thickness of the first frame body is 500 μm or shorter, the first frame body can be easily formed by etching or the like. Therefore, a package for a semiconductor device can be easily manufactured.

The lead portion may have a lead frame, a second metal film, and a third metal film. The lead frame may include a first main surface facing the second frame body, and a second main surface facing opposite to the first main surface. The lead frame may comprise a resin. The second metal film may be provided on the first main surface and may be conductively bonded to the first metal film. The third metal film may be provided on the second main surface.

The lead frame may include a plurality of vias electrically connecting the second metal film and the third metal film to each other. In this case, even if a semiconductor element inside a semiconductor device is electrically connected to one of the second metal film and the third metal film and an element outside the semiconductor device is electrically connected to the other of the second metal film and the third metal film, these elements can be electrically connected to each other. Therefore, the degree of freedom in design of a semiconductor device and the degree of freedom in design of a circuit including a semiconductor device are improved.

The lead portion may include a metal plate provided on the second frame body and conductively bonded to the first metal film. In this case, the external shape of the lead portion is easily formed by etching. Therefore, a package for a semiconductor device can be easily manufactured.

The second frame body may not have a via electrically connected to the first frame body or the first metal film. In this case, the shape of the second frame body becomes simpler. Therefore, compared to a case in which the second frame body has a via, a package for a semiconductor device can be easily manufactured.

An outer side surface of the second frame body may protrude to a region opposite to the first region beyond an outer side surface of the first frame body. In this case, when an electronic component disposed outside a semiconductor device comes close to the wall portion, it is likely that the electronic component comes into contact with the second frame body comprising a resin before the first frame body comprising a metal. Therefore, a short circuit between an electronic component disposed outside a semiconductor device, and the first frame body can be curbed.

An inner side surface of the second frame body may protrude toward the first region beyond an inner side surface of the first frame body. In this case, when a semiconductor element inside a semiconductor device comes close to the wall portion, it is likely that the semiconductor element comes into contact with the second frame body comprising a resin before the first frame body comprising a metal. Therefore, a short circuit between a terminal of a semiconductor element which is not electrically connected to the base plate, and the first frame body can be curbed.

The base plate and the first frame body may be conductively bonded to each other with a conductive bonding material interposed therebetween. In this case, the first frame body is more firmly fixed to the base plate, and at the same time, it is electrically connected to the base plate.

The first frame body and the second frame body may be bonded to each other with an insulating adhesive or a resin adhesive interposed therebetween. In this case, the second frame body is more firmly and simply fixed to the first frame body.

The semiconductor device according to the embodiment includes any of the foregoing packages and a semiconductor element. The semiconductor element is mounted inside the package. The lead portion is electrically connected to a semiconductor element via wiring inside the package. According to this semiconductor device, since it includes any of the foregoing packages, it is possible to provide a semiconductor device which has a wall portion containing a resin and in which impedance matching can be favorably performed while allowing excellent workability of a base plate.

A method for manufacturing a package for a semiconductor device according to the embodiment includes a first step and a second step. In the first step, a metal base plate has a first region and a second region surrounding the first region. In the first step, a first frame body comprising a metal has a bottom surface and a top surface facing opposite to the bottom surface. In the first step, the bottom surface of the first frame body is conductively bonded to the second region of the base plate. In the second step, a second frame body comprising a resin has a bottom surface and a top surface facing opposite to the bottom surface. In the second step, a first metal film is formed on the top surface of the second frame body. In the second step, a lead portion is conductively bonded to the first metal film. In the second step, the bottom surface of the second frame body is bonded to the top surface of the first frame body. Further, a first direction is a direction in which the first frame body and the second frame body are arranged. The thickness of the first frame body in the first direction is larger than the thickness of the first metal film in the first direction. According to this manufacturing method, it is possible to produce a package for a semiconductor device which has a wall portion containing a resin and in which impedance matching can be favorably performed while allowing excellent workability of a base plate.

A method for manufacturing a package for a semiconductor device according to another embodiment includes a first step, a second step, and a third step. In the first step, a metal base plate has a first region and a second region surrounding the first region. In the first step, a first frame body comprising a metal has a bottom surface and a top surface facing opposite to the bottom surface. In the first step, the bottom surface of the first frame body is conductively bonded to the second region of the base plate. In the second step, the second frame body comprising a resin has a bottom surface and a top surface facing opposite to the bottom surface. In the second step, a first metal film is formed on the top surface of the second frame body. In the second step, the bottom surface of the second frame body is bonded to the top surface of the first frame body. In the third step, a lead portion is conductively bonded to the first metal film. Further, a first direction is a direction in which the first frame body and the second frame body are arranged. The thickness of the first frame body in the first direction is larger than the thickness of the first metal film in the first direction. According to this manufacturing method, it is possible to produce a package for a semiconductor device which has a wall portion containing a resin and in which impedance matching can be favorably performed while allowing excellent workability of a base plate.

Details of Embodiment of Present Disclosure

Specific examples of the package for a semiconductor device and the semiconductor device of the present disclosure will be described below with reference to the drawings. The present invention is not limited to these examples. The present invention is indicated by the claims, and it is intended to include all the changes within the meaning and the scope equivalent to the claims. In the following description, the same reference signs are applied to the same elements in description of the drawings, and duplicate description thereof will be omitted.

Figure 3:
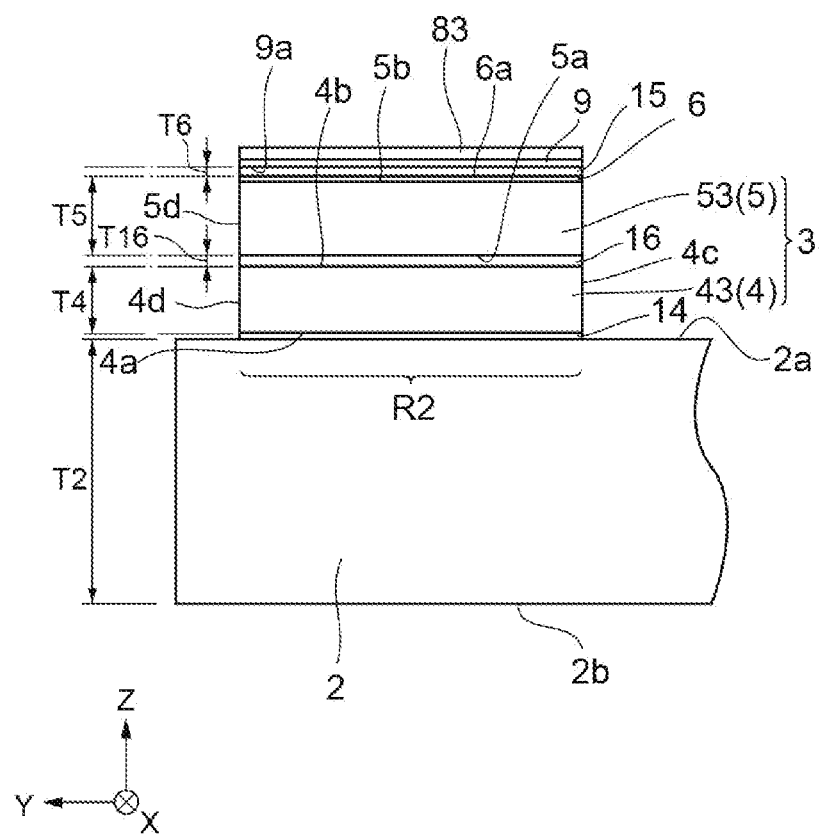
FIG. 3 is a view schematically illustrating a cross section along line III-III in FIG. 1.

FIG. 1 is a plan view of a package 1A for a semiconductor device according to an embodiment. FIG. 2 is a view schematically illustrating a cross section along line II-II in FIG. 1. FIG. 3 is a view schematically illustrating a cross section along line III-III in FIG. 1. As illustrated in FIGS. 1, 2, and 3, the package 1A of the present embodiment includes a base plate 2, a wall portion 3 having a first frame body 4 and a second frame body 5, a metal film 6 (first metal film), a lead portion 7, a first bonding material 14, a second bonding material 15, and an adhesive portion 16. In FIG. 1, a short side direction of the base plate 2 exhibiting substantially a rectangular shape will be referred to as a direction X, a long side direction will be referred to as a direction Y, and a direction which is orthogonal to the direction X and the direction Y and in which the first frame body 4 and the second frame body 5 are arranged will be referred to as a direction Z (first direction). Hereinafter, with reference to FIGS. 1, 2, and 3, each of the constituents of the package 1A of the present embodiment will be described.

The base plate 2 is a member having a flat metal main surface 2a and a flat rear surface 2b and is a plate-shaped member, for example. The base plate 2 has a first region R1 and a second region R2 surrounding the first region R1 on the main surface 2a. The second region R2 extends along an outer circumference of the main surface 2a. For example, the base plate 2 is formed of copper, an alloy of copper and molybdenum, or an alloy of copper and tungsten. Alternatively, the base plate 2 is formed of a laminated material including at least two plates of a copper plate, a molybdenum plate, a tungsten plate, an alloy plate of copper and molybdenum, and an alloy plate of copper and tungsten. In the example illustrated in the diagram, the base plate 2 is formed of an alloy consisting of copper, aluminum, molybdenum, tungsten, or the like. For example, a thickness T2 of the base plate 2 in the direction Z (refer to FIG. 3) is 0.5 mm or more and 1.5 mm or less, and is 1.0 mm, for example. The base plate 2 may be a heat radiator radiating heat generated inside the package 1A.

Figure 4:
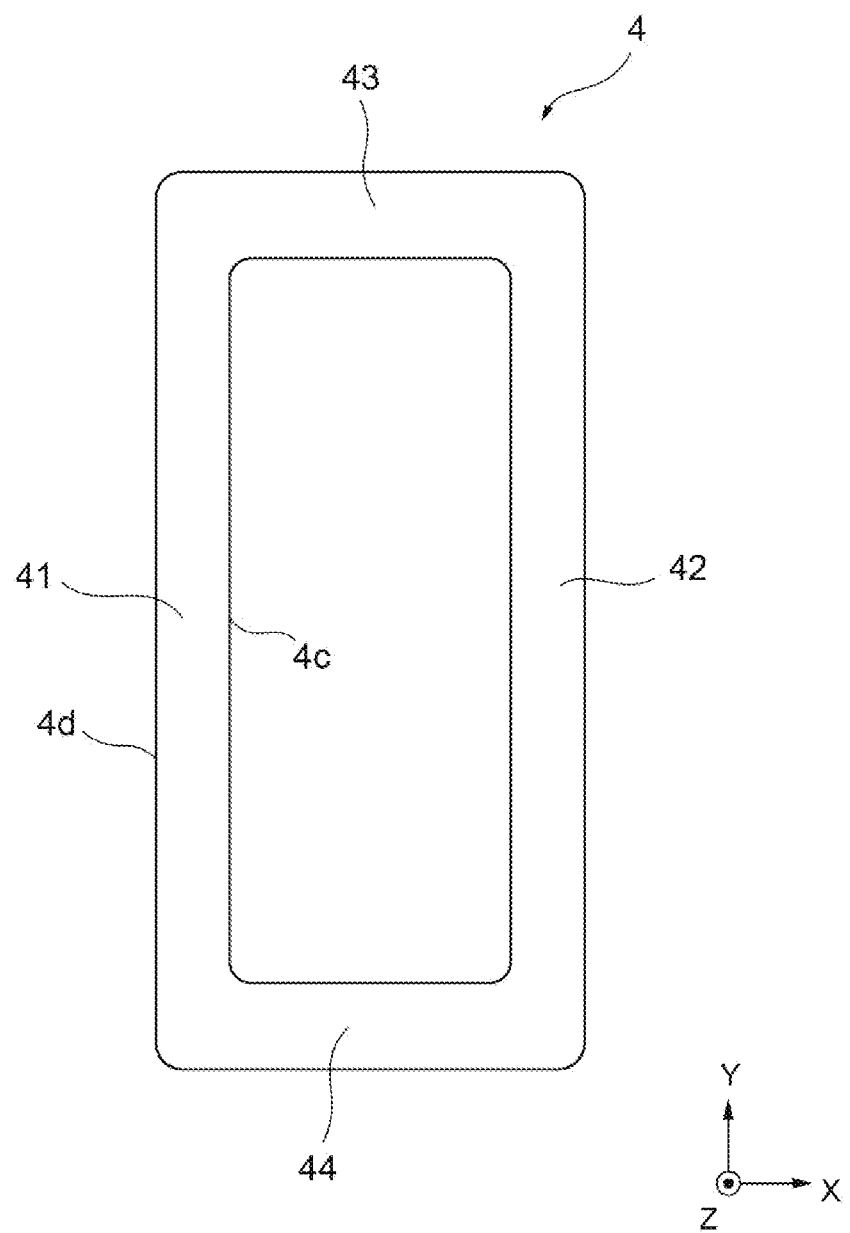
FIG. 4 is a plan view illustrating a first frame body.

The first frame body 4 is a member comprising a metal. For example, the first frame body 4 may be formed of native copper (tough pitch copper, oxygen-free copper, or the like) or may be formed of a copper alloy such as a lead frame material. The first frame body 4 is provided in the second region R2 on the main surface 2a of the base plate 2. FIG. 4 is a plan view illustrating the first frame body 4. As illustrated in FIG. 4, for example, the first frame body 4 exhibits substantially a rectangular frame shape. The first frame body 4 has a pair of parts 41 and 42 and a pair of parts 43 and 44. The pair of parts 41 and 42 face each other in the direction X. The parts 41 and 42 extend parallel to each other in the direction Y. The pair of parts 43 and 44 face each other in the direction Y. The parts 43 and 44 extend parallel to each other in the direction X. A cross section perpendicular to an extending direction of each of the parts 41, 42, 43, and 44 has a rectangular shape or a square shape. A thickness T4 of the first frame body 4 in the direction Z (refer to FIG. 3) is larger than a thickness T6 of the metal film 6 (refer to FIG. 3) which will be described below, and for example, the thickness T4 may be equal to or larger than four times the thickness T6. For example, the thickness T4 of the first frame body 4 in the direction Z is 100 µm or more and 500 µm or less, is more preferably 200 µm or more and 400 µm or less, and is 250 µm, for example.

As illustrated in FIGS. 2 and 3, the first frame body 4 has a bottom surface 4a and a top surface 4b. The bottom surface 4a is a flat surface facing the main surface 2a of the base plate 2. The top surface 4b is a surface facing opposite to the bottom surface 4a. The first frame body 4 has an inner side surface 4c and an outer side surface 4d. The inner side surface 4c extends along an inner circumference of the first frame body 4. The outer side surface 4d opposes with the inner side surface 4c and extends along an outer circumference of the first frame body 4. The inner side surface 4c and the outer side surface 4d join the bottom surface 4a and the top surface 4b to each other. The entire surface of the bottom surface 4a is subjected to plating of nickel (Ni) after film formation of tungsten (W). As illustrated in FIGS. 2 and 3, the entire surface of the bottom surface 4a is conductively bonded to the main surface 2a of the base plate 2 with the first bonding material 14 interposed therebetween. The first bonding material 14 has conductivity. For example, the first bonding material 14 is a bonding material containing a solder or silver (Ag). Examples of a bonding material containing Ag include a silver braze and a different silver-based bonding material. For example, the first bonding material 14 may be a solder paste, an epoxy adhesive containing a metal filler, or a sintered nano-metal paste. Namely, the base plate 2 and the first frame body 4 are conductively bonded to each other with the first bonding material 14, having conductivity, interposed therebetween.

Figure 5:
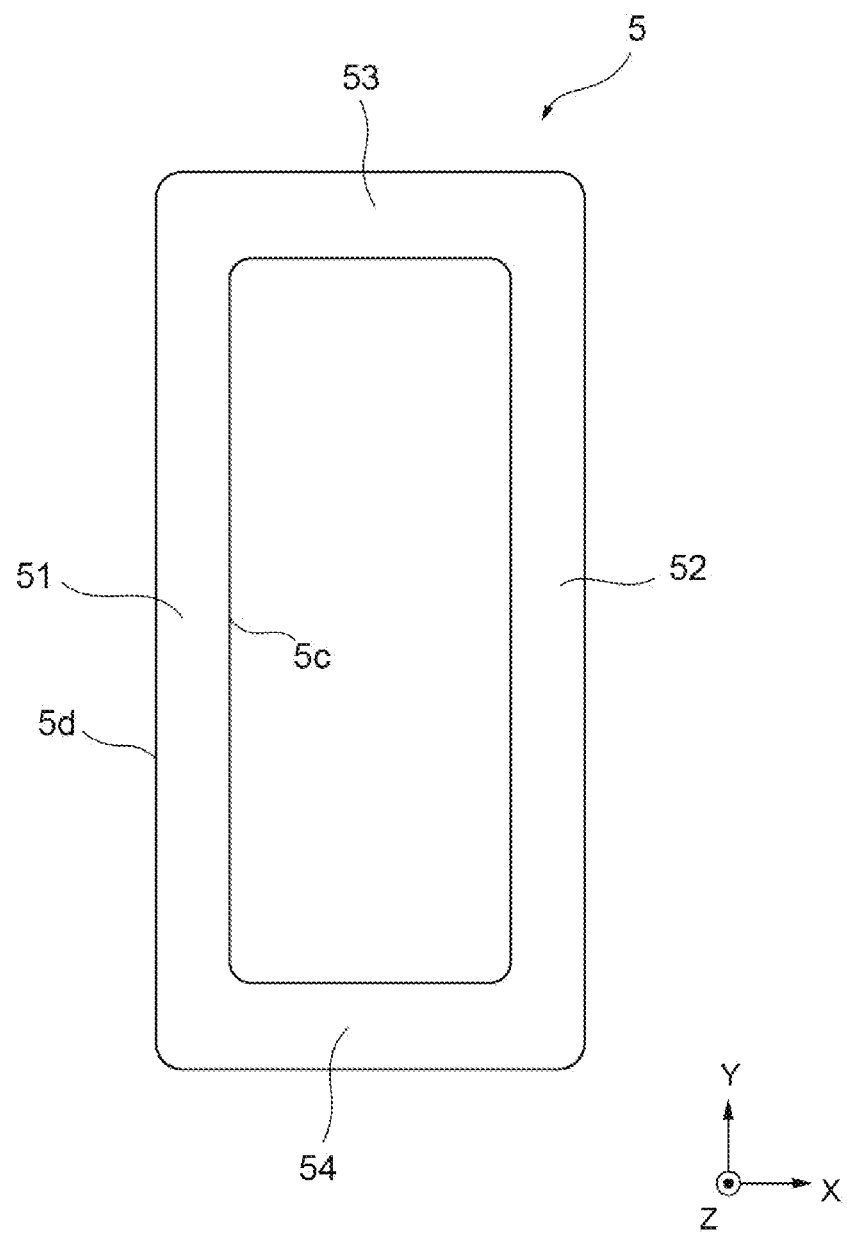
FIG. 5 is a plan view illustrating a second frame body.

The second frame body 5 is a member comprising a resin. The second frame body 5 is provided on the first frame body 4. The second frame body 5 is bonded to the first frame body 4 with the adhesive portion 16 interposed therebetween. FIG. 5 is a plan view illustrating the second frame body 5. As illustrated in FIG. 5, for example, the second frame body 5 exhibits substantially a rectangular frame shape. The second frame body 5 has a pair of parts 51 and 52 and a pair of parts 53 and 54. The pair of parts 51 and 52 face each other in the direction X. The parts 51 and 52 extend parallel to each other in the direction Y. The pair of parts 53 and 54 face each other in the direction Y. The parts 53 and 54 extend parallel to each other in the direction X. A cross section perpendicular to the extending direction of each of the parts 51, 52, 53, and 54 has a rectangular shape or a square shape. For example, a thickness T5 of the second frame body 5 in the direction Z (refer to FIG. 3) is 100 µm or more and 500 µm or less, is more preferably 200 µm or more and 400 µm or less, and is 250 µm, for example.

The second frame body 5 does not have a via electrically connected to the first frame body 4 or the metal film 6 which will be described below. Specifically, a constitution in which a metal film is embedded inside the second frame body 5 and a constitution in which a via penetrates a part between the metal film and the first frame body 4 or the metal film 6 are not provided in the second frame body 5. A constitution in which a metal film is embedded inside the second frame body 5 and a constitution in which a metal film for connecting the metal film and the first frame body 4 or the metal film 6 to each other is formed on at least one of an inner side surface 5c and an outer side surface 5d of the second frame body 5 are not provided in the second frame body 5.

As illustrated in FIGS. 2 and 3, the second frame body 5 has a bottom surface 5a and a top surface 5b. The bottom surface 5a faces the top surface 4b of the first frame body 4 in the direction Z. The top surface 5b is a surface facing opposite to the bottom surface 5a. The second frame body 5 has the inner side surface 5c and the outer side surface 5d. The inner side surface 5c extends along an inner circumference of the second frame body 5. The outer side surface 5d opposes with the inner side surface 5c and extends along an outer circumference of the second frame body 5. The inner side surface 5c joins the bottom surface 5a and the top surface 5b to each other. The outer side surface 5d joins the bottom surface 5a and the top surface 5b to each other. As illustrated in FIGS. 2 and 3, the entire surface of the bottom surface 5a of the second frame body 5 is bonded to the top surface 4b of the first frame body 4 with the adhesive portion 16 interposed therebetween. The adhesive portion 16 has insulating properties. For example, the adhesive portion 16 is an insulating adhesive or a resin adhesive (for example, a thermosetting resin or a thermoplastic resin). Namely, the first frame body 4 and the second frame body 5 are bonded to each other with the adhesive portion 16, having insulating properties, interposed therebetween. A thickness T16 of the adhesive portion 16 in the direction Z (refer to FIG. 3) is 10 µm, for example.

In the present embodiment, the inner side surface 4c of the first frame body 4 is flush with the inner side surface 5c of the second frame body 5. That is, the inner side surface 4c and the inner side surface 5c do not protrude inward of the wall portion 3 with respect to each other. In the present embodiment, the outer side surface 4d of the first frame body 4 is flush with the outer side surface 5d of the second frame body 5. That is, the outer side surface 4d and the outer side surface 5d do not protrude outward of the wall portion 3 with respect to each other.

The metal film 6 is provided on the top surface 5b of the second frame body 5. The metal film 6 extends in the direction X and the direction Y along the top surface 5b of the second frame body 5. In the direction X and the direction Y, one end of the metal film 6 reaches the inner side surface 5c of the second frame body 5 and is exposed from the inner side surface 5c. In the direction X and the direction Y, the other end of the metal film 6 reaches the outer side surface 5d of the second frame body 5 and is exposed from the outer side surface 5d. For example, the metal film 6 is formed of copper. For example, the thickness T6 of the metal film 6 in the direction Z (refer to FIG. 3) is 8 µm or more and 120 µm or less, is more preferably 12 µm or more and 70 µm or less, and is 35 µm, for example.

The lead portion 7 is provided on the metal film 6. As illustrated in FIGS. 1 and 2, the lead portion 7 has a lead frame 8, a metal film 9 (second metal film), and a plurality of metal films 10, 11, 12, and 13 (third metal films). The lead frame 8 has a first main surface 8a facing the second frame body 5, and a second main surface 8b facing opposite to the first main surface 8a. The metal film 9 is provided on the first main surface 8a. The plurality of metal films 10, 11, 12, and 13 are provided on the second main surface 8b.

The lead frame 8 is made of a resin and exhibits substantially a rectangular frame shape, for example. The lead frame 8 extends in the direction X and the direction Y along the second frame body 5. The first main surface 8a of the lead frame 8 faces the top surface 5b of the second frame body 5. In the present embodiment, the lead frame 8 has a pair of parts 81 and 82 and a pair of parts 83 and 84. The pair of parts 81 and 82 face each other in the direction X. The parts 81 and 82 extend parallel to each other in the direction Y. The pair of parts 83 and 84 face each other in the direction Y. The parts 83 and 84 extend parallel to each other in the direction X. Moreover, as illustrated in FIG. 1, the lead frame 8 has a pair of protrusion portions 85 and 86 and a pair of protrusion portions 87 and 88. As illustrated in FIG. 1, the pair of protrusion portions 85 and 86 are disposed closer to the part 83 than a centerline L1 of the package 1A in the direction X. The pair of protrusion portions 87 and 88 are disposed closer to the part 84 than the centerline L1. The protrusion portions 85 and 87 protrude to a region opposite to the first region R1 from the part 81 in the direction X. The protrusion portions 86 and 88 protrude to a region opposite to the first region R1 from the part 82 in the direction X.

The metal film 9 extends along the first main surface 8a of the lead frame 8. The metal film 9 faces the top surface 5b of the second frame body 5. In the present embodiment, the metal film 9 extends along the parts 81, 82, 83, and 84 and the protrusion portions 85, 86, 87, and 88. The metal film 9 covers at least a part of the first main surface 8a facing the top surface 5b of the second frame body 5.

As illustrated in FIGS. 2 and 3, the metal film 9 has a lower surface 9a facing the metal film 6. The metal film 6 has an upper surface 6a facing opposite to the surface facing the second frame body 5. The upper surface 6a of the metal film 6 is bonded to the lower surface 9a of the metal film 9 with the second bonding material 15 interposed therebetween. The second bonding material 15 has conductivity. For example, the second bonding material 15 is a bonding material containing a solder or silver (Ag). Examples of a bonding material containing Ag include a silver braze and a different silver-based bonding material. For example, the second bonding material 15 may be a solder paste, an epoxy adhesive containing a metal filler, or a sintered nano-metal paste.

The plurality of metal films 10, 11, 12, and 13 are arranged along the lead frame 8. Specifically, the plurality of metal films 10, 11, 12, and 13 are provided on the second main surface 8b of the lead frame 8. In the present embodiment, the metal film 10 is provided on the second main surface 8b in the part 81 and the protrusion portion 85, in a region positioned on the part 83 side of two regions divided by the centerline L1. The metal film 11 is provided on the second main surface 8b in the part 82 and the protrusion portion 86, in a region positioned on the part 83 side of two regions divided by the centerline L1. The metal film 12 is provided on the second main surface 8b in the part 81 and the protrusion portion 87, in a region positioned on the part 84 side of two regions divided by the centerline L1. The metal film 13 is provided on the second main surface 8b in the part 82 and the protrusion portion 88, in a region positioned on the part 84 side of two regions divided by the centerline L1. The plurality of metal films 10, 11, 12, and 13 are separated from each other and are electrically insulated from each other.

Figure 6:
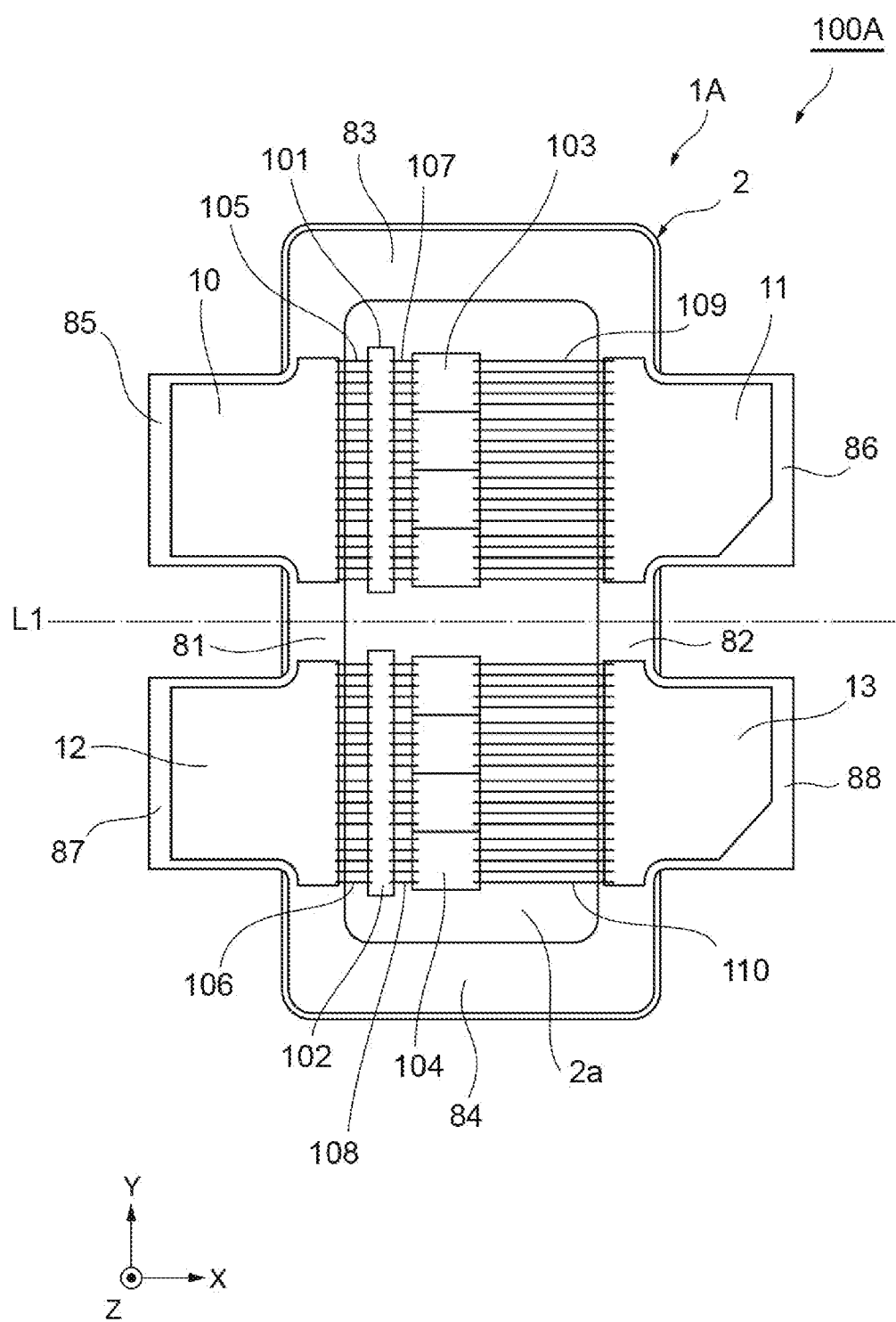
FIG. 6 is a plan view illustrating a constitution of a semiconductor device including the package of the embodiment.

FIG. 6 is a plan view illustrating a constitution of a semiconductor device 100A including the package 1A of the present embodiment described above. FIG. 6 illustrates a state in which a lid portion of the semiconductor device 100A is detached. This semiconductor device 100A includes a matching circuit 101, a matching circuit 102, a plurality of semiconductor elements 103, and a plurality of semiconductor elements 104, in addition to the package 1A. The matching circuit 101, the matching circuit 102, the plurality of semiconductor elements 103, and the plurality of semiconductor elements 104 are mounted on the first region R1. The first region R1 is surrounded by the wall portion 3 on the main surface 2a of the base plate 2. Signal input electrodes of the plurality of semiconductor elements 103 are electrically connected to the metal film 10 via the matching circuit 101 and a plurality of bonding wires 105 and 107. Signal output electrodes of the plurality of semiconductor elements 103 are electrically connected to the metal film 11 via bonding wires 109. Signal input electrodes of the plurality of semiconductor elements 104 are electrically connected to the metal film 12 via the matching circuit 102 and a plurality of bonding wires 106 and 108. Signal output electrodes of the plurality of semiconductor elements 104 are electrically connected to the metal film 13 via bonding wires 110.

The matching circuit 101 and each of the semiconductor elements 103 are provided side by side in this order from the part 81 of the lead frame 8 in the direction X. The matching circuit 101 and the plurality of semiconductor elements 103 are disposed in a region closer to the part 83 than the centerline L1 (refer to FIG. 1) in the first region R1. For example, the matching circuit 101 exhibits an elongated shape and extends in the direction Y. The plurality of semiconductor elements 103 are disposed side by side in the direction Y. The matching circuit 101 and the plurality of semiconductor elements 103 are fixed on the base plate 2 by means of a conductive paste.

The metal film 10 and one end of the matching circuit 101 near the metal film 10 are electrically connected to each other through the plurality of bonding wires 105. The other end of the matching circuit 101 on the semiconductor element 103 side and each of the semiconductor elements 103 are electrically connected to each other through the plurality of bonding wires 107. The matching circuit 101 performs impedance matching between the metal film 10 and the semiconductor elements 103.

The matching circuit 102 and each of the semiconductor elements 104 are provided side by side in this order from the part 81 of the lead frame 8 in the direction X. The matching circuit 102 and the plurality of semiconductor elements 104 are disposed in a region closer to the part 84 than the centerline L1 (refer to FIG. 1) in the first region R1. For example, the matching circuit 102 exhibits an elongated shape and extends in the direction Y. The plurality of semiconductor elements 104 are disposed side by side in the direction Y. The matching circuit 102 and the plurality of semiconductor elements 104 are fixed on the base plate 2 by means of a conductive paste.

The metal film 12 and one end of the matching circuit 102 near the metal film 12 are electrically connected to each other through the plurality of bonding wires 106. The other end of the matching circuit 102 on the semiconductor element 104 side and each of the semiconductor elements 104 are electrically connected to each other through the plurality of bonding wires 108. The matching circuit 102 performs impedance matching between the metal film 12 and the semiconductor elements 104.

Figure 8:
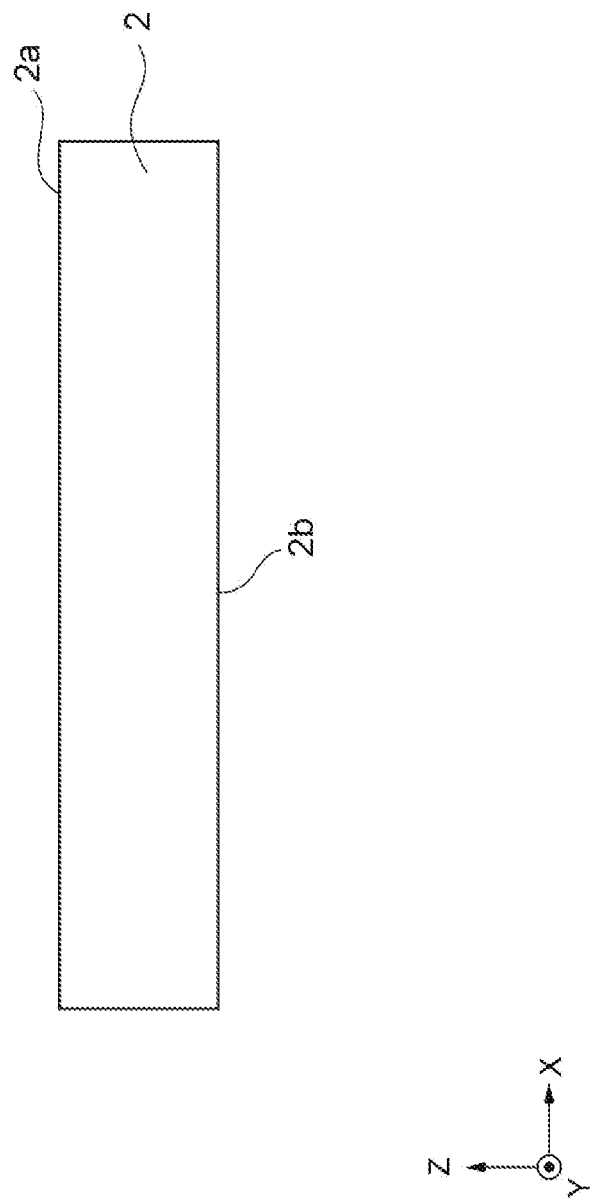
FIG. 8 is a view schematically illustrating a cross section along line VIII-VIII in FIG. 7.

Here, a method for manufacturing the package 1A of the present embodiment will be described. FIGS. 7 to 20 are explanatory views of the method for manufacturing the package 1A and the semiconductor device 100A. FIGS. 7, 9, 11, 13, 15, 17, and 19 are plan views respectively illustrating steps in the method for manufacturing the package 1A and the semiconductor device 100A. FIGS. 8, 10, 12, 14, 16, 18, and 20 are cross-sectional views respectively illustrating steps in the method for manufacturing the package 1A and the semiconductor device 100A. FIG. 8 is a view schematically illustrating a cross section along line VIII-VIII in FIG. 7. Similar to FIG. 8, FIGS. 10, 12, 14, 16, 18, and 20 are views schematically illustrating cross sections along line X-X in FIG. 9, along line XII-XII in FIG. 11, along line XIV-XIV in FIG. 13, along line XVI-XVI in FIG. 15, along line XVIII-XVIII in FIG. 17, and along line XX-XX in FIG. 19, respectively.

Figure 15:
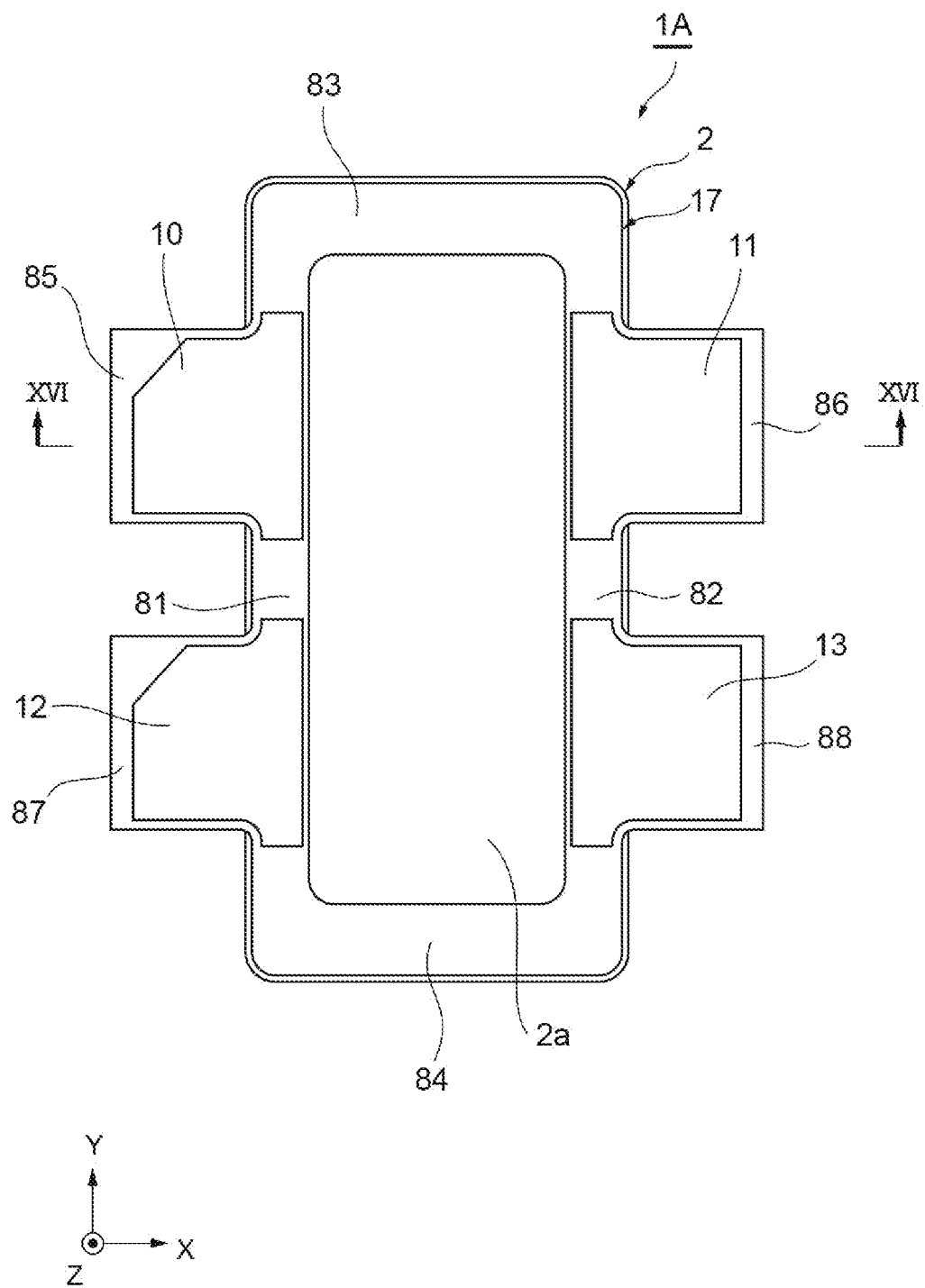
FIG. 15 is a plan view illustrating a step in the method for manufacturing a package and a semiconductor device.
Figure 16:
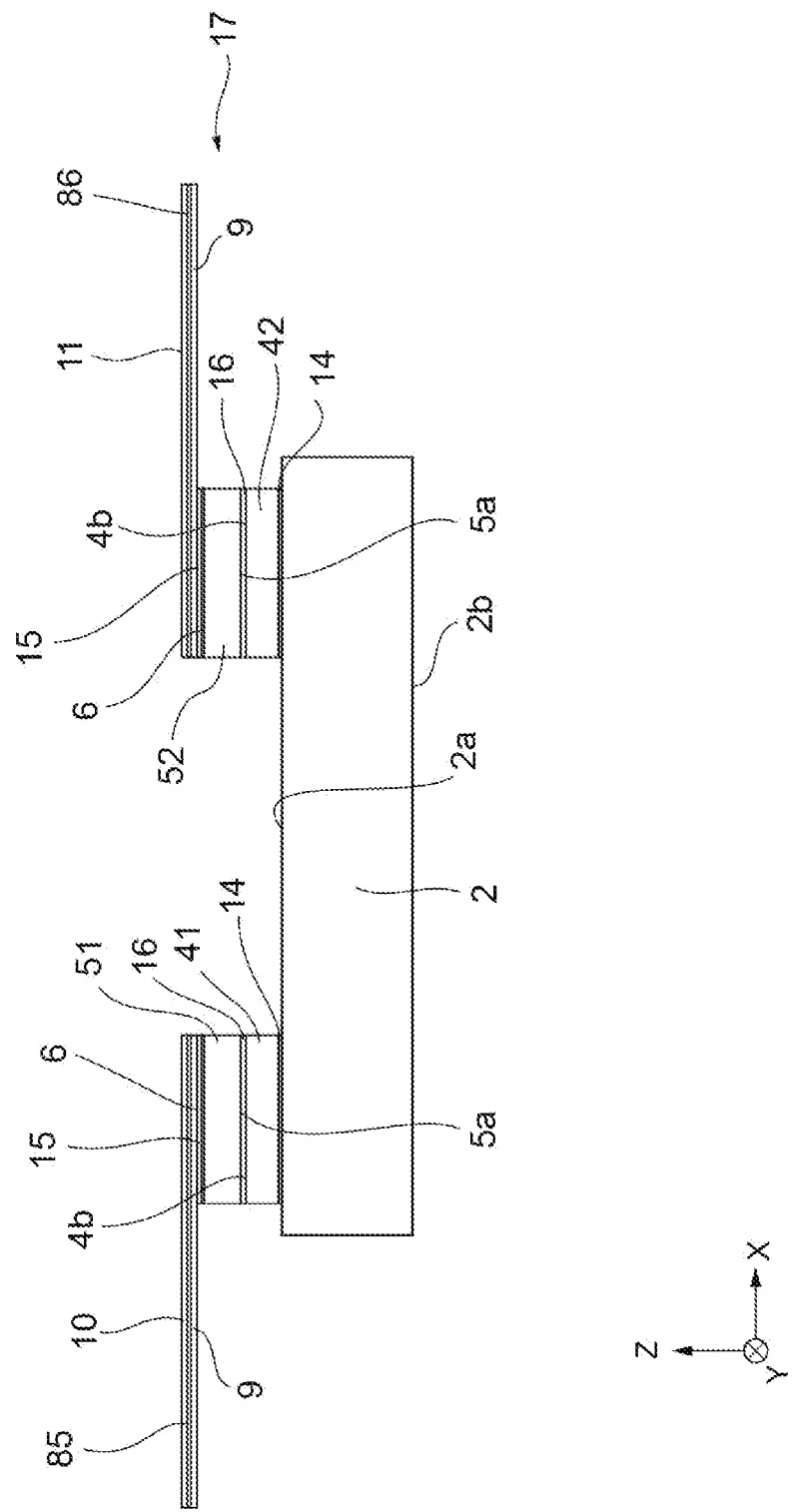
FIG. 16 is a view schematically illustrating a cross section along line XVI-XVI in FIG. 15.

First, the second frame body 5, the metal film 6, the lead portion 7, and the second bonding material 15 are integrally assembled as an assembly 17 illustrated in FIGS. 15 and 16. Specifically, first, the second frame body 5 and the lead frame 8 are prepared. Further, the metal film 9 is formed on the first main surface 8a of the lead frame 8. The plurality of metal films 10, 11, 12, and 13 are formed on the second main surface 8b of the lead frame 8. Meanwhile, the metal film 6 is formed on the top surface 5b of the second frame body 5. Subsequently, the upper surface 6a of the metal film 6 is coated with the second bonding material 15 thereon, and the lower surface 9a of the metal film 9 is fixed to the upper surface 6a with the second bonding material 15 interposed therebetween. The assembly 17 is formed in this manner. For example, the plurality of metal films 6, 9, 10, 11, 12, and 13 are formed by vapor deposition.

Next, in the steps illustrated in FIGS. 7 and 8, the base plate 2 having the main surface 2a and the rear surface 2b is prepared.

Figure 10:
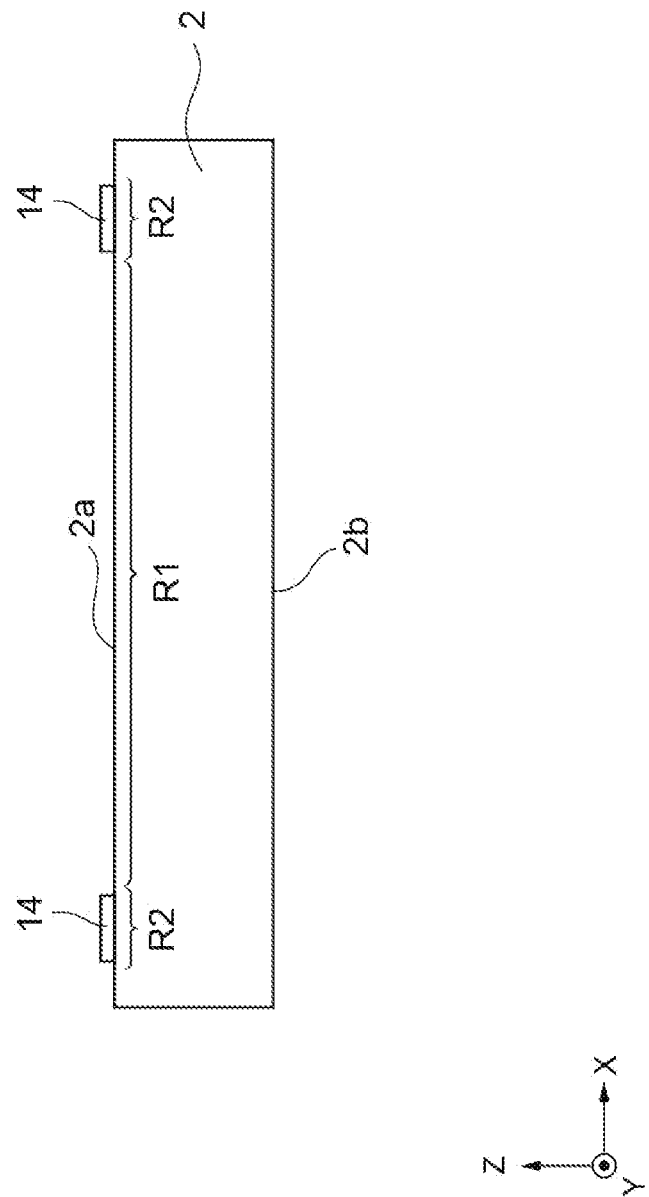
FIG. 10 is a view schematically illustrating a cross section along line X-X in FIG. 9.
Figure 11:
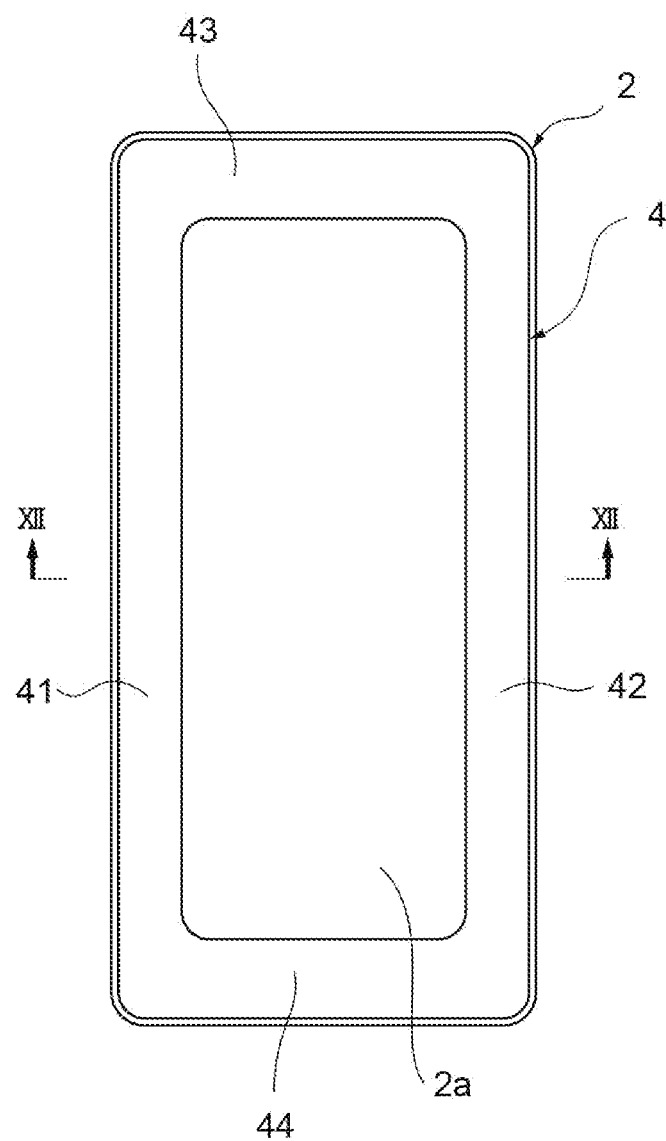
FIG. 11 is a plan view illustrating a step in the method for manufacturing a package and a semiconductor device.
Figure 12:
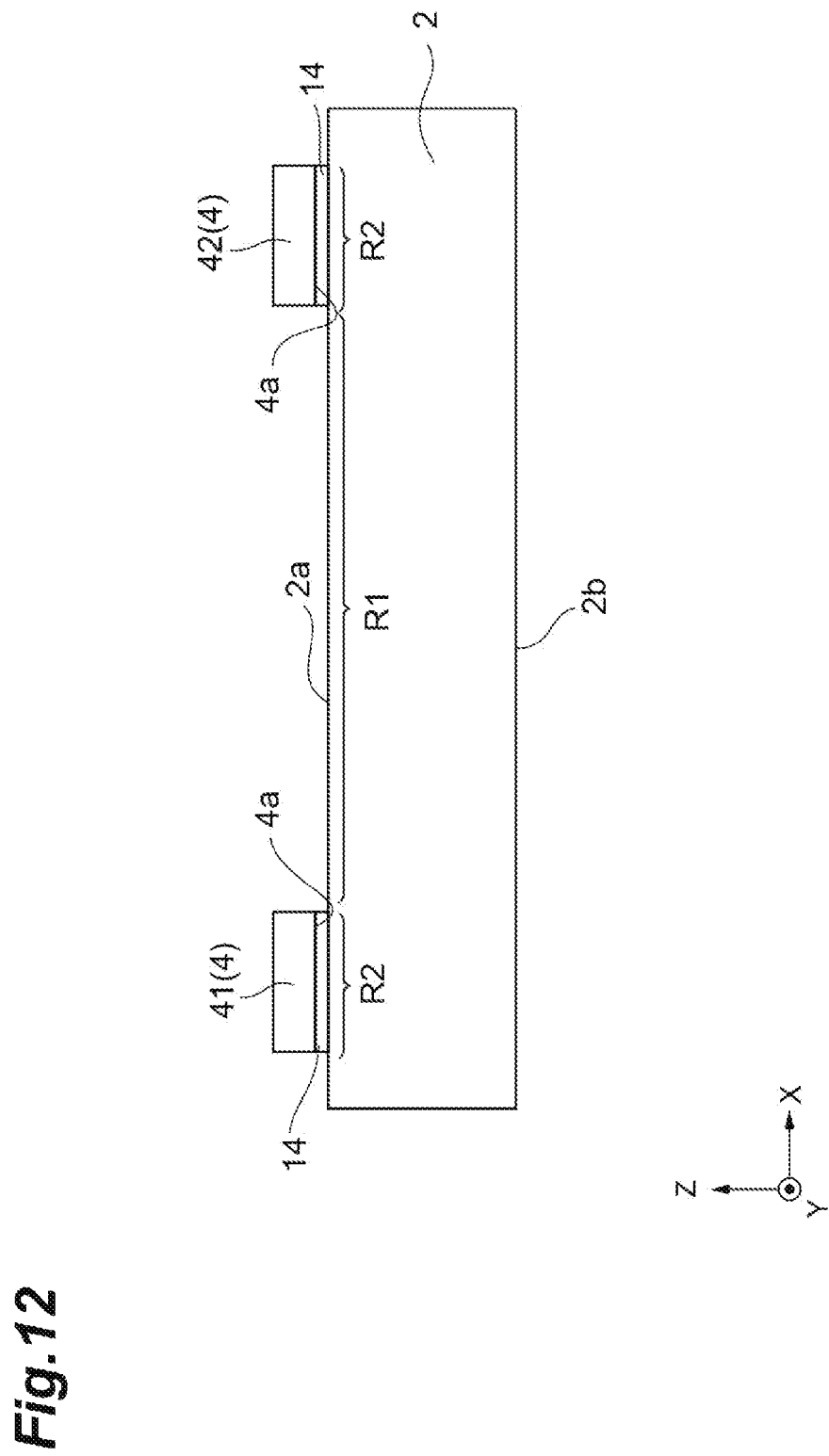
FIG. 12 is a view schematically illustrating a cross section along line XII-XII in FIG. 11.

Subsequently, in the steps illustrated in FIGS. 9 and 10, the second region R2 on the main surface 2a of the base plate 2 is coated with the first bonding material 14 thereon. For example, coating with the first bonding material 14 is performed by printing. In this case, as illustrated in FIG. 9, for example, the first bonding material 14 is intermittently disposed in an island-shaped distribution. Alternatively, for example, coating with the first bonding material 14 may be performed by means of a dispenser. In this case, the first bonding material 14 is continuously distributed in a circumferential direction of the second region R2. Subsequently, in the steps illustrated in FIGS. 11 and 12, the bottom surface 4a of the first frame body 4 is conductively bonded to the second region R2 of the base plate 2 with the first bonding material 14 interposed therebetween.

Figure 13:
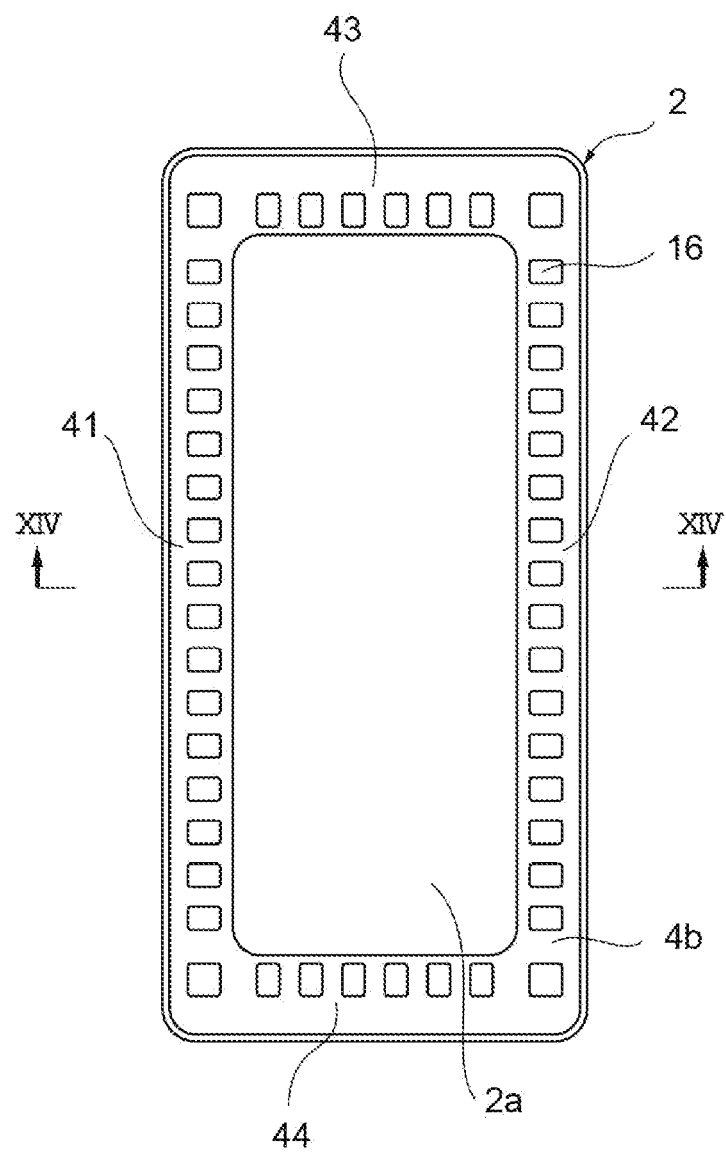
FIG. 13 is a plan view illustrating a step in the method for manufacturing a package and a semiconductor device.
Figure 14:
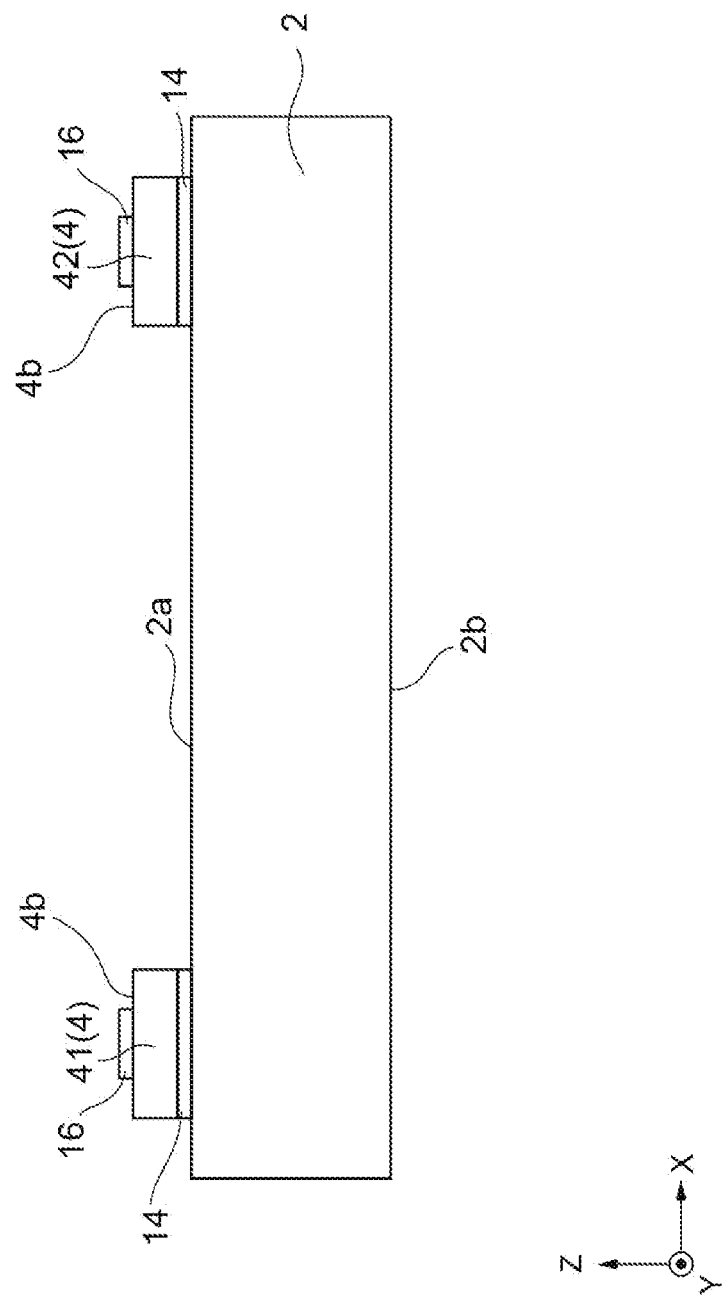
FIG. 14 is a view schematically illustrating a cross section along line XIV-XIV in FIG. 13.

Subsequently, in the steps illustrated in FIGS. 13 and 14, the top surface 4b of the first frame body 4 is coated with the adhesive portion 16. For example, coating with the adhesive portion 16 is performed by printing. In this case, as illustrated in FIG. 13, for example, the adhesive portion 16 is intermittently disposed in an island-shaped distribution. Alternatively, for example, coating with the adhesive portion 16 may be performed by means of a dispenser. In this case, the adhesive portion 16 is continuously distributed in the circumferential direction of the second region R2. Subsequently, in the steps illustrated in FIGS. 15 and 16, the assembly 17 which has been assembled first is disposed on the first frame body 4. At this time, the bottom surface 5a of the second frame body 5 of the assembly 17 faces the top surface 4b of the first frame body 4 with the adhesive portion 16 sandwiched therebetween. Thereafter, when the adhesive portion 16 is cured, the bottom surface 5a of the second frame body 5 is bonded to the top surface 4b of the first frame body 4. For example, the adhesive portion 16 may be cured through two-stage heat treatment or may be cured through heat treatment using continuous temperature profiles. The package 1A is completed through the foregoing steps.

Figure 17:
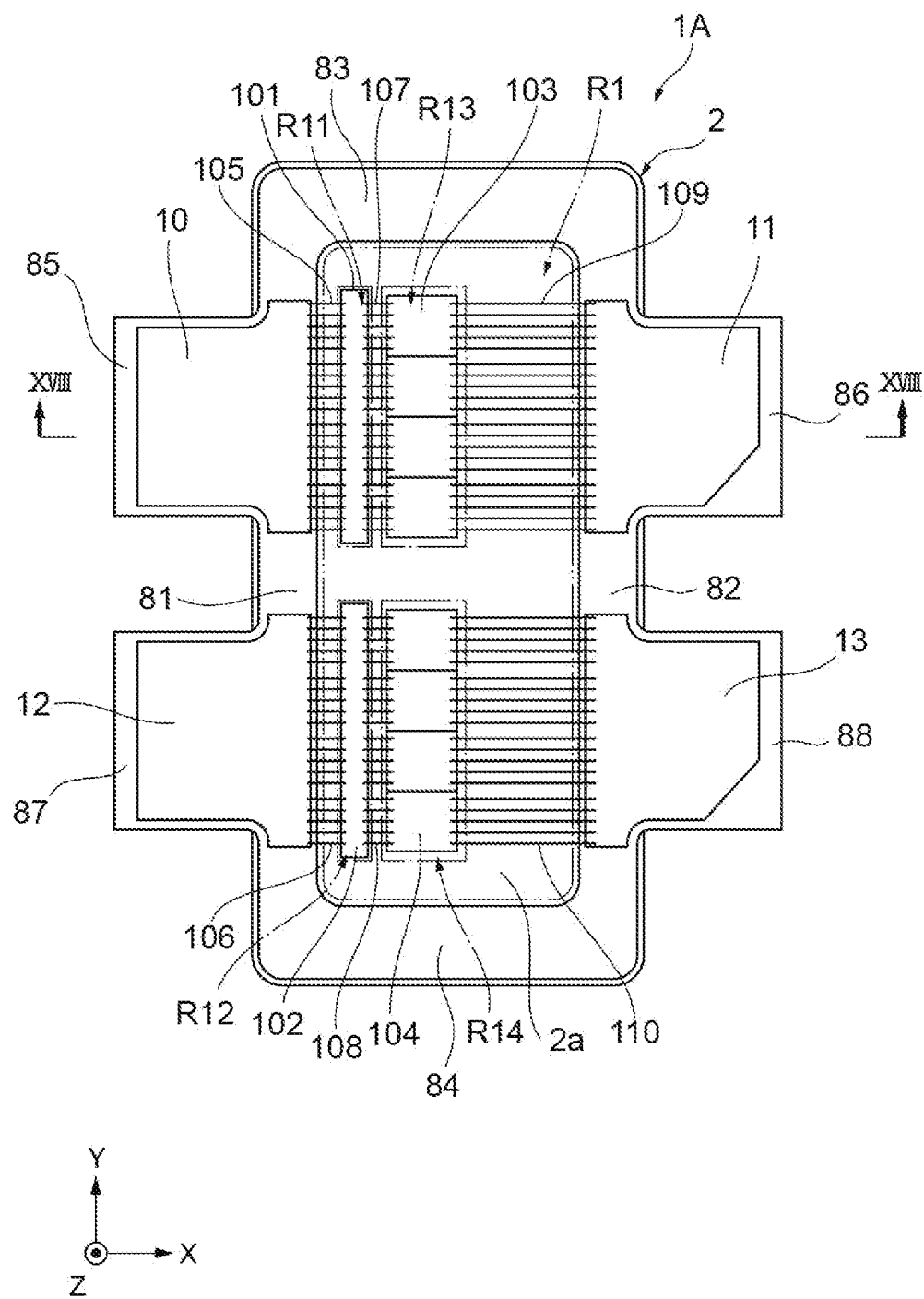
FIG. 17 is a plan view illustrating a step in the method for manufacturing a package and a semiconductor device.
Figure 18:
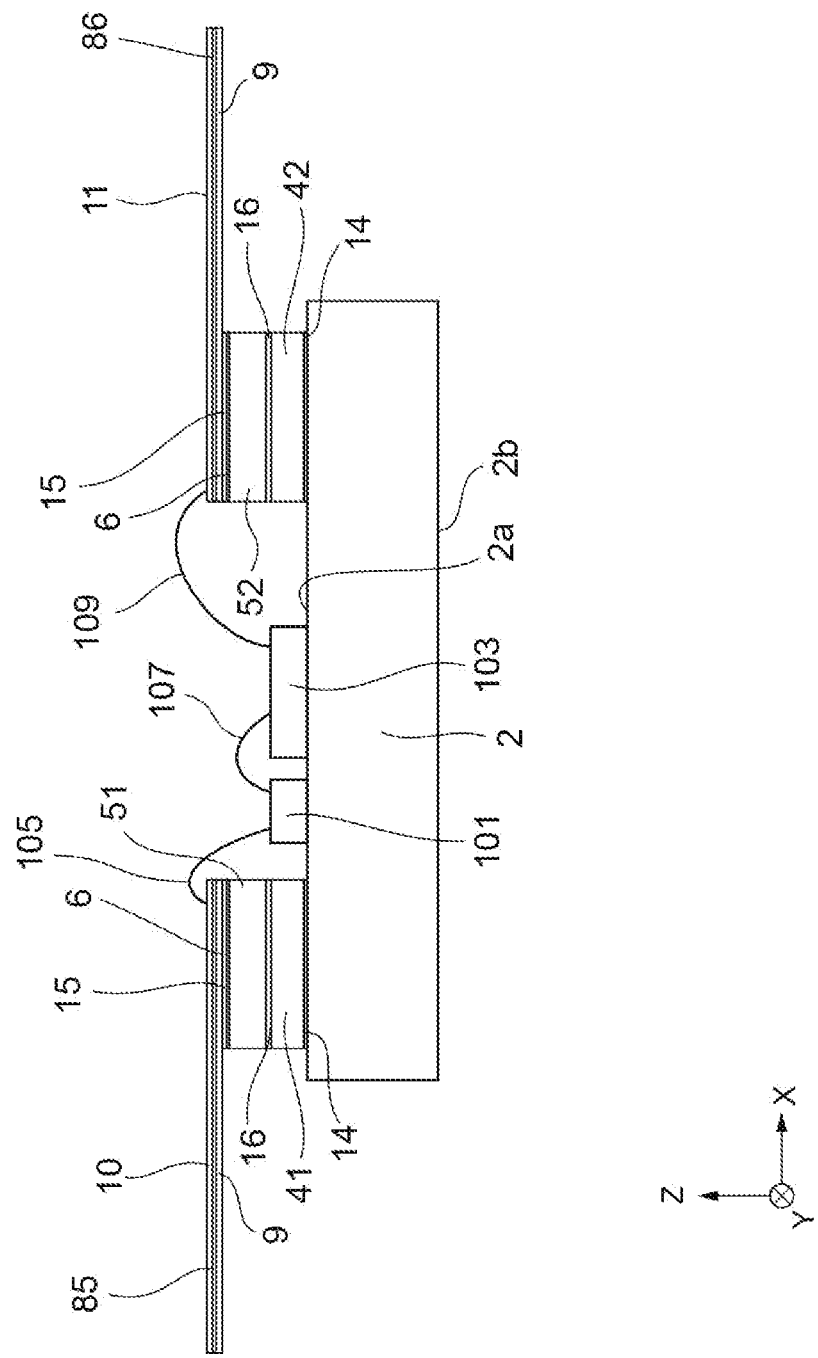
FIG. 18 is a view schematically illustrating a cross section along line XVIII-XVIII in FIG. 17.

Subsequently, in the steps illustrated in FIGS. 17 and 18, the main surface 2a of the base plate 2 is coated with a metal paste. For example, the metal paste is a sintered type. Specifically, a plurality of regions R11, R12, R13, and R14 are provided on the main surface 2a. The region R11 is a region in which the matching circuit 101 is mounted. The region R12 is a region in which the matching circuit 102 is mounted. The region R13 is a region in which the plurality of semiconductor elements 103 are mounted. The region R14 is a region in which the plurality of semiconductor elements 104 are mounted. The plurality of regions R11, R12, R13, and R14 are collectively coated with a metal paste by screen printing, for example. Further, each of the matching circuit 101, the matching circuit 102, the plurality of semiconductor elements 103, and the plurality of semiconductor elements 104 is disposed on the metal paste coating the plurality of regions R11, R12, R13, and R14. Further, the metal paste is cured. Thereafter, wire bonding is performed by means of the plurality of bonding wires 105, 106, 107, 108, 109, and 110. Specifically, ultrasonic bonding is performed while the package 1A in its entirety is heated to approximately 200° C.

Figure 19:
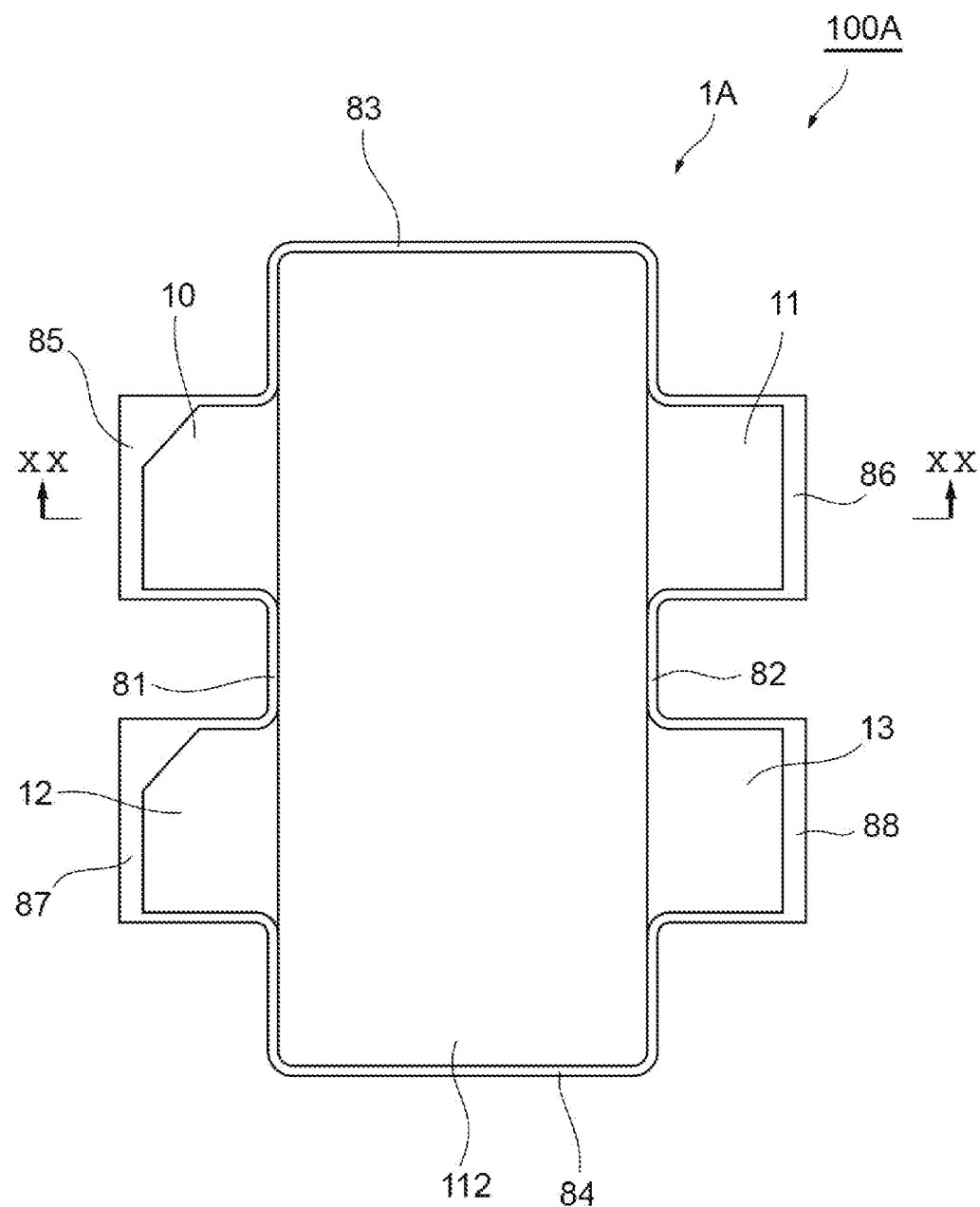
FIG. 19 is a plan view illustrating a step in the method for manufacturing a package and a semiconductor device.
Figure 20:
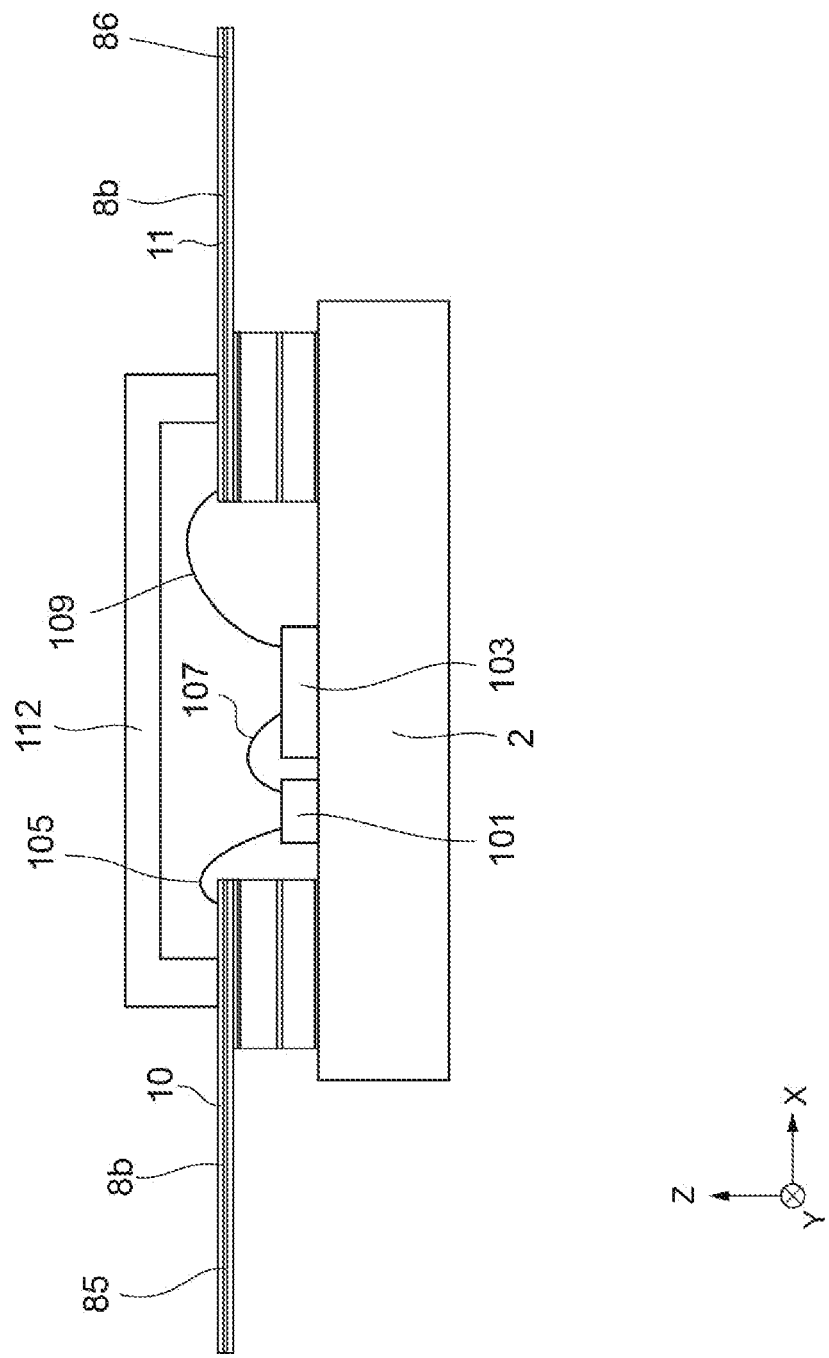
FIG. 20 is a view schematically illustrating a cross section along line XX-XX in FIG. 19.

Last, in the steps illustrated in FIGS. 19 and 20, the second main surface 8b of the lead frame 8 is coated with an adhesive thereon. Further, a lid portion 112 covers the lead frame 8. Moreover, the second main surface 8b of the lead frame 8 and the lid portion 112 face each other with the adhesive interposed therebetween. The plurality of metal films 10, 11, 12, and 13 provided on the second main surface 8b of the lead frame 8 and the lid portion 112 face each other with the adhesive interposed therebetween. Thereafter, the adhesive is cured. For example, the adhesive may be cured through two-stage heat treatment or may be cured through heat treatment using continuous temperature profiles. The semiconductor device 100A is completed through the foregoing steps.

In the manufacturing method described above, the assembly 17 is first bonded to the first frame body 4 after the assembly 17 is prepared. The order of formation and bonding is not limited thereto. For example, after the bottom surface 5a of the second frame body 5 is bonded to the top surface 4b of the first frame body 4, the upper surface 6a of the metal film 6 on the top surface 5b of the second frame body 5 may be coated with the second bonding material 15, and the lead portion 7 may be fixed thereto.

Effects achieved by the package 1A and the semiconductor device 100A of the present embodiment having the foregoing constitutions will be described. As illustrated in FIG. 2, in the package 1A, the wall portion 3 having the first frame body 4 comprising a metal and the second frame body 5 comprising a resin is provided on the base plate 2 comprising a metal. Further, the plurality of metal films 10, 11, 12, and 13 are formed on the wall portion 3. The plurality of metal films 10, 11, 12, and 13 are connected to the electrodes of the semiconductor elements 103 or the semiconductor elements 104. Accordingly, the second frame body 5 comprising a resin is sandwiched between the first frame body 4 comprising a metal and the plurality of metal films 10, 11, 12, and 13. As a result, a microstrip line having the first frame body 4 as a ground potential and the plurality of metal films 10, 11, 12, and 13 as signal lines is constituted. Therefore, according to the present embodiment, it is possible to provide the package 1A capable of inputting and outputting a high-frequency signal.

Figure 21:
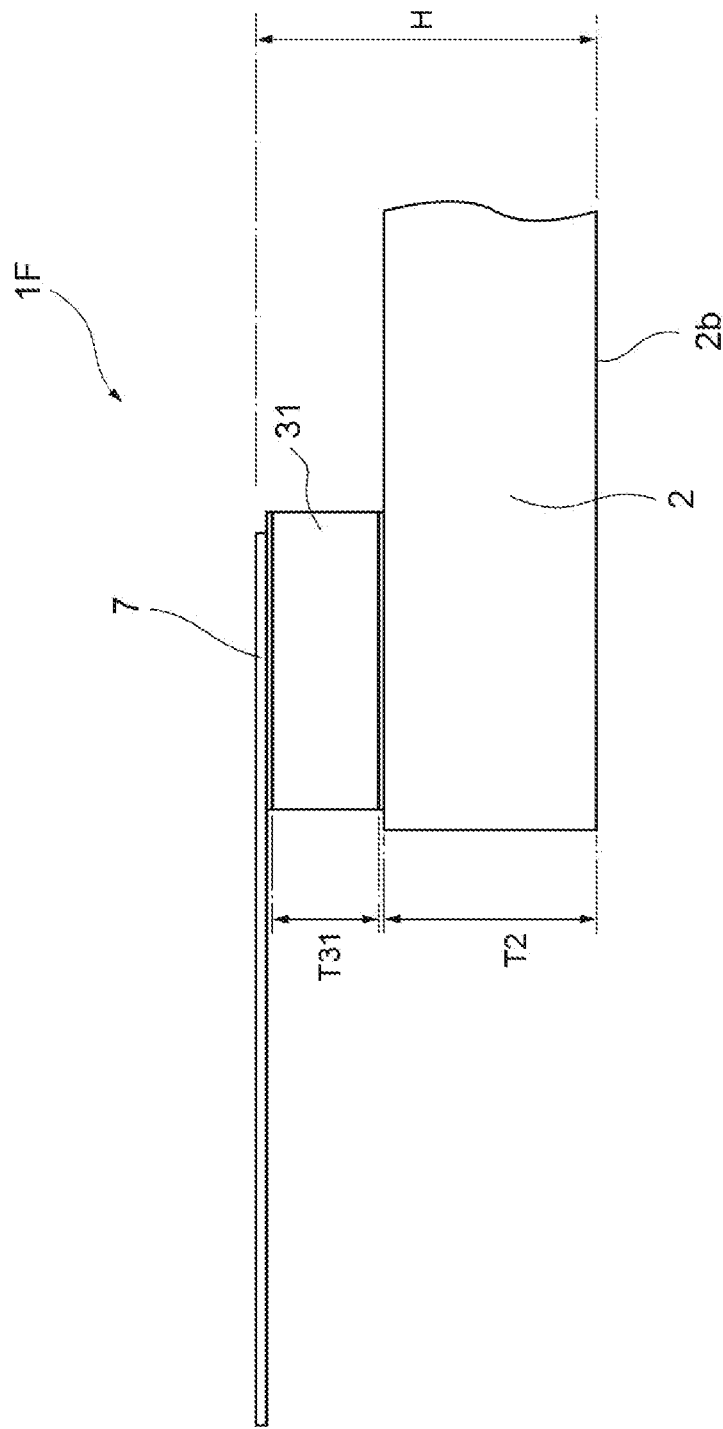
FIG. 21 is a view schematically illustrating a constitution of a package for a semiconductor device according to a comparative example.
Figure 22:
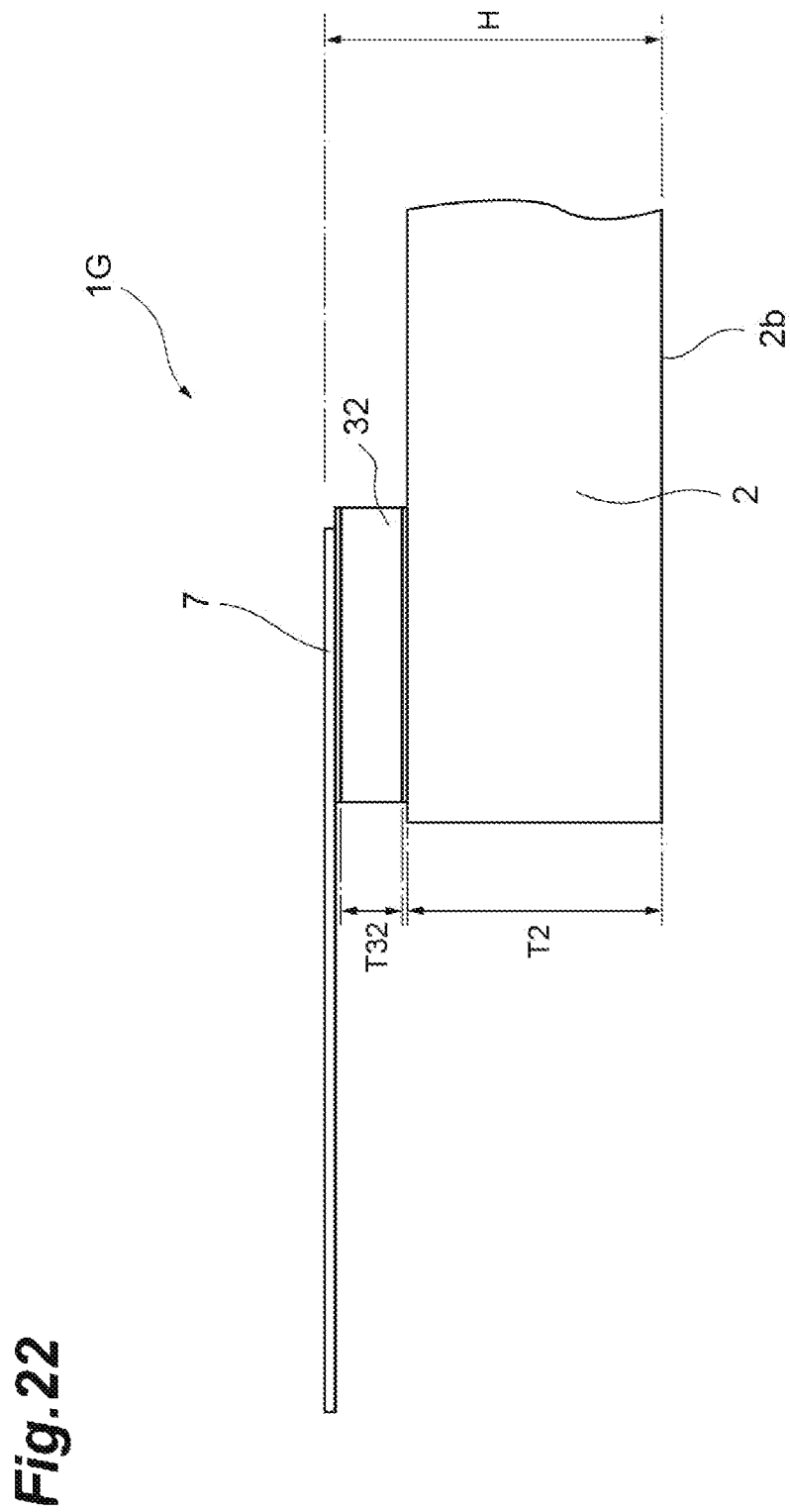
FIG. 22 is a view schematically illustrating a constitution of a package for a semiconductor device according to another comparative example.

Here, comparative examples will be described. FIG. 21 is a view schematically illustrating a part of a constitution of a package 1F for a semiconductor device according to a comparative example. The package 1F includes a ceramic wall portion 31 in place of the wall portion 3 of the present embodiment. FIG. 22 is a view schematically illustrating a part of a constitution of a package 1G for a semiconductor device according to another comparative example. The package 1G includes a resin wall portion 32 in place of the wall portion 3 of the present embodiment.

The ceramic wall portion 31 illustrated in FIG. 21 has high reliability compared to other materials such as a resin, and it can firmly support the lead portion 7. Meanwhile, when airtight sealing is not necessary in a semiconductor device (for example, a semiconductor element mounted in a semiconductor device has moisture resistance) or the like, the resin wall portion 32 illustrated in FIG. 22 is used.

Here, the dielectric constant of a resin is outstandingly smaller than the dielectric constant of a ceramic. For example, the dielectric constant of an alumina that is one of ceramics is 9.8. In contrast, for example, the dielectric constant of a flame retardant type 4 (FR 4) is 4 to 5, the dielectric constants of a bismaleimide triazine (BT) material and a poly phenylene ether (PPE) material which are often used for high-frequency use are 3 to 4, and the dielectric constant of a Teflon (registered trademark)-based material for super high-frequency is 2 to 3. When the dielectric constant of the wall portion is small, the impedance of the lead portion 7 on the wall portion increases, and it moves to the outward side in a Smith chart in a manner similar to the inductance of the lead potion 7.

Hence, in order to reduce the impedance by securing a capacitance suitable for impedance matching in the lead portion 7 provided on the resin wall portion 32, it is favorable that a thickness T32 of the wall portion 32 (refer to FIG. 22) is smaller than a thickness T31 of the wall portion 31 (refer to FIG. 21). However, in regard to design, it may not be allowed to change a height H from the rear surface 2b of the base plate 2 to the lead portion 7. In such a case, it is conceivable to increase the thickness of the base plate 2 by the amount corresponding to the reduced thickness T32 of the wall portion 32. That is, as illustrated in FIG. 22, the thickness T2 of the base plate 2 increases by the amount obtained by subtracting the thickness T32 of the wall portion 32 from the thickness T31 of the wall portion 31. Here, in order to match the coefficient of linear expansion of the base plate 2 with the coefficient of linear expansion of the semiconductor elements 103 and 104 using Si or SiC, a material such as molybdenum or tungsten having a low coefficient of linear expansion is used for the material of the base plate 2. It is difficult to perform working of these metals due to the high hardness and the high melting point thereof. Therefore, when the thickness T2 of the base plate 2 increases, it is more difficult to perform working of the base plate 2.

In order to resolve the foregoing problems, in the package 1A of the present embodiment, the thickness T5 of the second frame body 5 comprising a resin can be reduced while the height from the rear surface 2b of the base plate 2 to the lead portion 7 is maintained, because of increasing the thickness T4 of the first frame body 4 comprising a metal. Accordingly, a capacitance suitable for impedance matching can be secured in the lead portion 7 while the thickness of the wall portion 3 is maintained. Therefore, according to the package 1A of the present embodiment, there is no need to increase the thickness T2 of the base plate 2 when the wall portion 3 containing a resin is used, and thus excellent workability of the base plate 2 can be maintained. The distance between the top surface 4b of the first frame body 4 and the lead portion 7 is shortened so that impedance matching can be favorably performed.

When a ceramic having a high dielectric constant is used for the insulation part of the microstrip line (for example, the wall portion 31 in FIG. 21), the electrical length in the insulation part is lengthened, and phase rotation increases. In contrast, in the package 1A of the present embodiment, the insulation part of the microstrip line, that is, the second frame body 5 is made of a resin having a lower dielectric constant than a ceramic. Therefore, the electrical length in the insulation part is shortened and phase rotation decreases, and thus it is possible to come close to ideal matching.

Here, a reason that the thickness T4 of the first frame body 4 is larger than the thickness T6 of the metal film 6 will be described. Since the first frame body 4 is provided mainly for the purpose of bonding the base plate 2 and the second frame body 5 to each other, there is no need to perform working thereof into a fine and complicated planar shape. For example, since the first frame body 4 has a simple planar shape such as a quadrangular frame shape, it is possible to perform working by etching or the like even if it is thick to a certain degree. Since the first frame body 4 has a thickness to a certain degree, a strength for retaining the shape of the first frame body 4 can be secured. In contrast, impedance characteristics at a high frequency can be adjusted by devising the size and the planar shape of the metal film 6. Therefore, it is desirable that the metal film 6 have a thin film shape in order to facilitate working by etching for a fine and complicated planar shape.

As in the present embodiment, the thickness T4 of the first frame body 4 in the direction Z may be 100 µm or more and 500 µm or less. When the thickness T4 of the first frame body 4 is 100 µm or longer, the first frame body 4 has a sufficient strength so that the shape of the first frame body 4 is more reliably retained when the package 1A is assembled. Moreover, a capacitance suitable for impedance matching can be secured by sufficiently reducing the thickness T5 of the second frame body 5.

Moreover, the first frame body 4 is a member intended for bonding. The first frame body 4 exhibits a simple shape instead of a fine or complicated wiring shape. Further, when the thickness T4 of the first frame body 4 is 500 µm or shorter, the first frame body 4 can be formed by etching. Therefore, the package 1A can be easily manufactured.

As in the present embodiment, the second frame body 5 may not have a via electrically connected to the first frame body 4 or the metal film 6. In this case, the shape of the second frame body 5 becomes simpler. Therefore, compared to a case in which the second frame body 5 has a via, the package 1A can be easily manufactured.

As in the present embodiment, the base plate 2 and the first frame body 4 may be conductively bonded to each other with the first bonding material 14, having conductivity, interposed therebetween. In this case, the first frame body 4 is more firmly fixed to the base plate 2, and at the same time, it is electrically connected to the base plate 2.

As in the present embodiment, the first frame body 4 and the second frame body 5 may be bonded to each other with the adhesive portion 16 that is an insulating adhesive or a resin adhesive interposed therebetween. In this case, the second frame body 5 is more firmly and simply fixed to the first frame body 4.

The semiconductor device 100A according to the present embodiment includes the package 1A, the plurality of semiconductor elements 103, and the plurality of semiconductor elements 104. The plurality of semiconductor elements 103 and the plurality of semiconductor elements 104 are mounted inside the package 1A. The plurality of metal films 10, 11, 12, and 13 of the lead portion 7 are electrically connected to the semiconductor elements 103 or the semiconductor elements 104 respectively via at least one of the plurality of bonding wires 105, 106, 107, 108, 109, and 110 which are wiring inside the package 1A. According to this semiconductor device 100A, since it includes the package 1A, it is possible to provide a semiconductor device which has the wall portion 3 containing a resin and in which impedance matching can be favorably performed while allowing excellent workability of the base plate 2.

The method for manufacturing the package 1A according to the present embodiment includes at least two steps. In a first step, the bottom surface 4a of the first frame body 4 is conductively bonded in the second region R2 of the base plate 2. In a second step, the bottom surface 5a of the second frame body 5 in the assembly 17 including the second frame body 5 and the lead portion 7 is bonded to the top surface 4b of the first frame body 4. Further, the thickness T4 of the first frame body 4 is larger than the thickness T6 of the metal film 6. According to this manufacturing method, it is possible to produce the package 1A which has the wall portion 3 containing a resin and in which impedance matching can be favorably performed while allowing excellent workability of the base plate 2. In the second step, the bottom surface 5a of the second frame body 5 may be bonded to the top surface 4b of the first frame body 4 in a state in which the lead portion 7 is not bonded to the metal film 6. Further, thereafter, the lead portion 7 may be bonded to the metal film 6. Even in this case, similar effects can be exhibited.

First Modification Example

Figure 23:
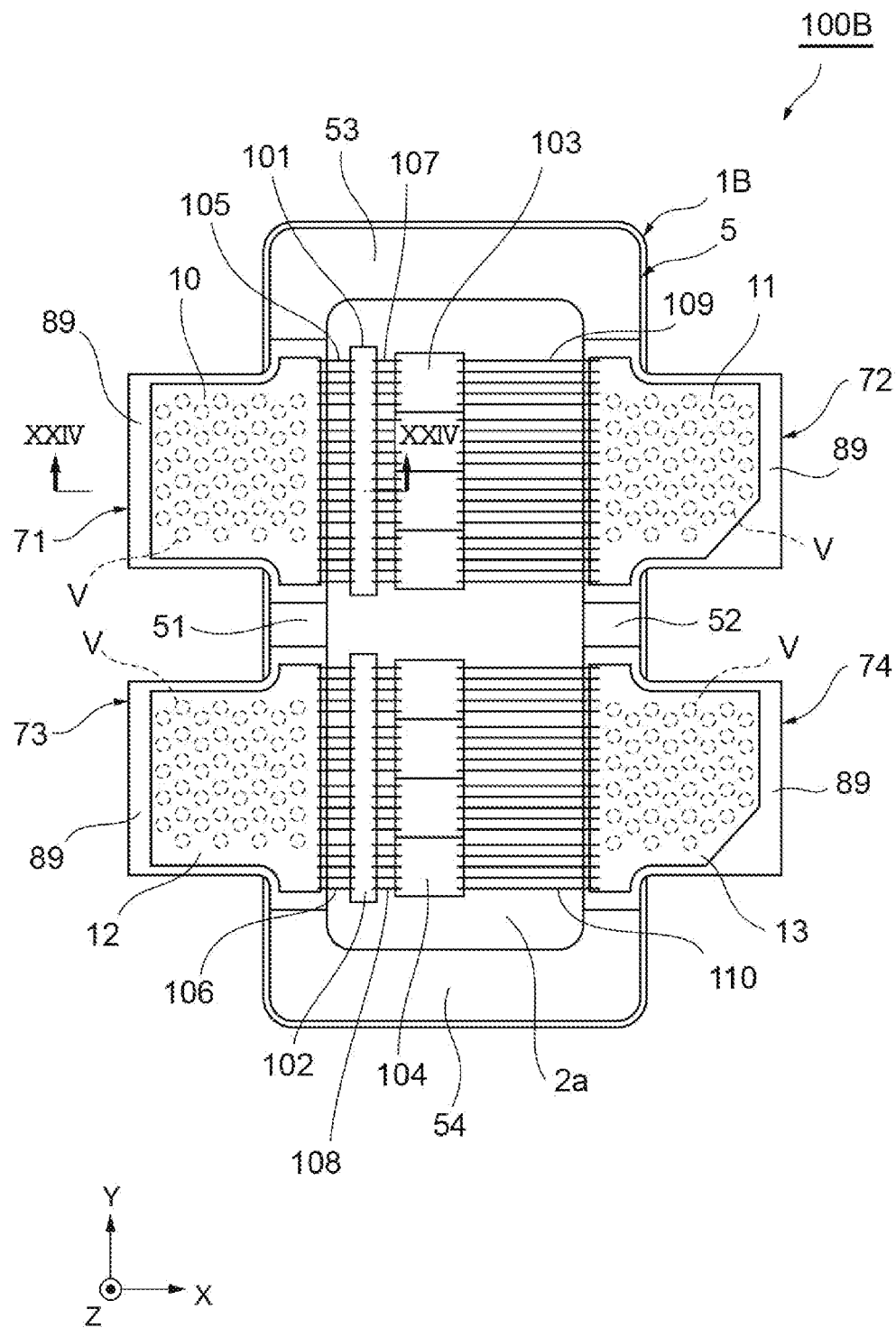
FIG. 23 is a plan view illustrating a package for a semiconductor device and a semiconductor device according to a first modification example.
Figure 24:
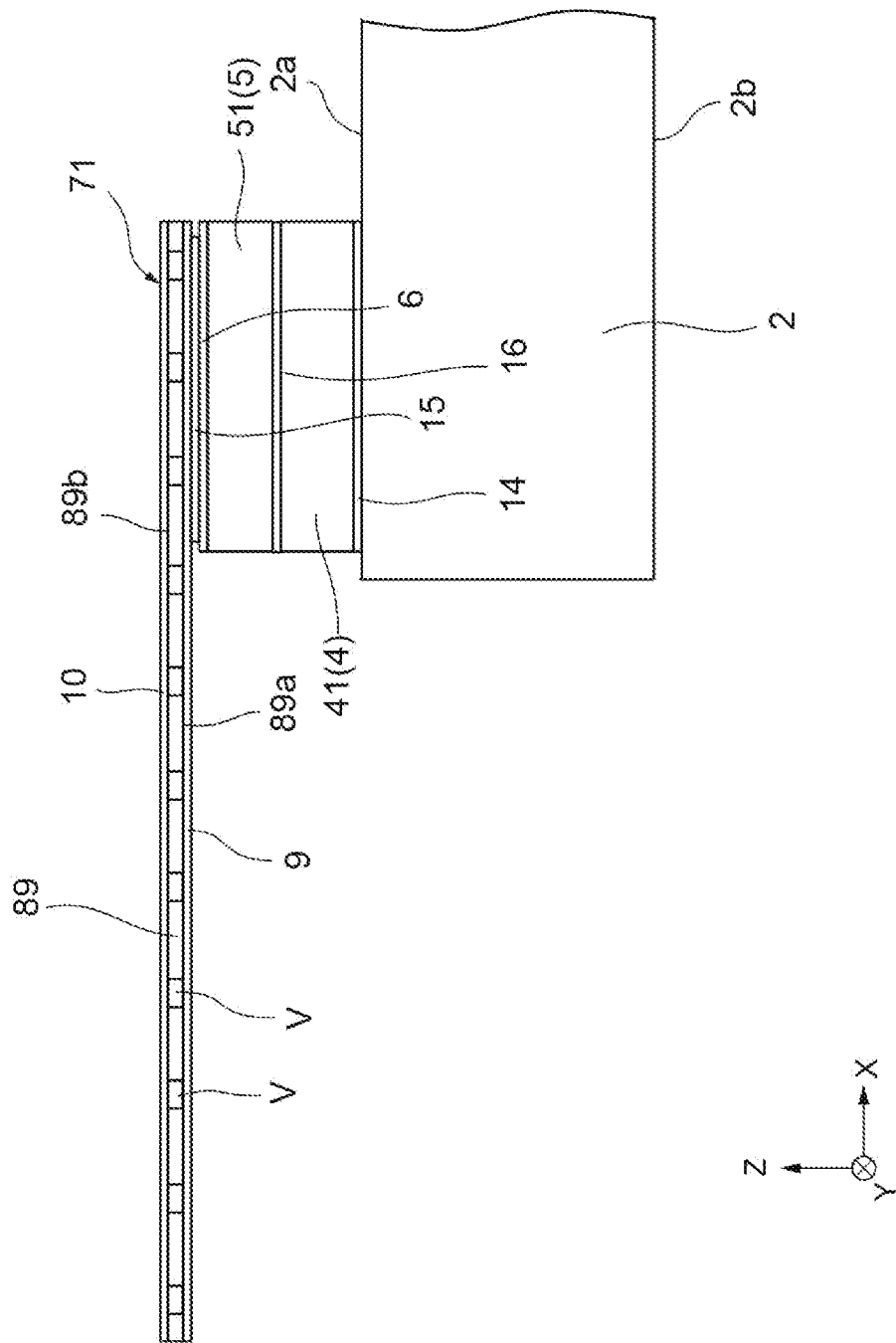
FIG. 24 is a view schematically illustrating a cross section along line XXIV-XXIV in FIG. 23.

FIG. 23 is a plan view illustrating a package 1B for a semiconductor device and a semiconductor device 100B according to a first modification example of the foregoing embodiment. FIG. 24 is a view schematically illustrating a cross section corresponding to line XXIV-XXIV in FIG. 23 and illustrates a cross section of a part of the package 1B.

The package 1B and the semiconductor device 100B of the present modification example differ from the package 1A and the semiconductor device 100A of the foregoing embodiment in the following matters and coincide therewith in other matters. Hereinafter, description will be given with reference to FIGS. 23 and 24.

The package 1A includes a plurality of lead portions 71, 72, 73, and 74 in place of the lead portion 7 of the foregoing embodiment. The plurality of lead portions 71, 72, 73, and 74 are provided on the metal film 6. The plurality of lead portions 71, 72, 73, and 74 respectively have the plurality of metal films 10, 11, 12, and 13. Each of the plurality of lead portions 71, 72, 73, and 74 has a lead frame 89 and the metal film 9. The lead frame 89 of each of the plurality of lead portions 71, 72, 73, and 74 has a first main surface 89a facing the second frame body 5 and a second main surface 89b facing opposite to the first main surface 89a. The first main surface 89a faces the top surface 5b of the second frame body 5. The metal film 9 is provided on the first main surface 89a of the lead frame 89. The metal film 9 faces the top surface 5b of the second frame body 5. The metal film 9 is bonded to the metal film 6 with the second bonding material 15 interposed therebetween. Each of the plurality of metal films 10, 11, 12, and 13 is provided on the second main surface 89b of the lead frame 89.

The constituent material of the lead frame 89 is similar to that of the lead frame 8 of the foregoing embodiment. The planar shape and disposition of the lead frame 89 of the lead portion 71 are similar to those of a portion realized by adding a part of the part 81 to the protrusion portion 85 of the foregoing embodiment. The planar shape and disposition of the lead frame 89 of the lead portion 72 are similar to those of a portion realized by adding a part of the part 82 to the protrusion portion 86 of the foregoing embodiment. The planar shape and disposition of the lead frame 89 of the lead portion 73 are similar to those of a portion realized by adding a part of the part 81 to the protrusion portion 87 of the foregoing embodiment. The planar shape and disposition of the lead frame 89 of the lead portion 74 are similar to those of a portion realized by adding a part of the part 82 to the protrusion portion 88 of the foregoing embodiment.

In the present modification example, being different from the foregoing embodiment, the parts 53 and 54 of the second frame body 5 are exposed from the lead frame 89. In the part 51 of the second frame body 5, a part positioned between the lead portions 71 and 73 in a plan view is exposed from the lead frame 89. In the part 52 of the second frame body 5, a part positioned between the lead portions 72 and 74 in a plan view is exposed from the lead frame 89.

The lead frame 89 of each of the plurality of lead portions 71, 72, 73, and 74 has a plurality of vias V. The plurality of vias V penetrate the lead frame 89 between the first main surface 89a and the second main surface 89b. In the lead portion 71, one end of each via V is connected to the metal film 10, and the other end thereof is connected to the metal film 9. Accordingly, the metal film 10 and the metal film 9 are electrically connected to each other via the plurality of vias V. In the lead portion 72, one end of each via V is connected to the metal film 11, and the other end thereof is connected to the metal film 9. Accordingly, the metal film 11 and the metal film 9 are electrically connected to each other via the plurality of vias V. In the lead portion 73, one end of each via V is connected to the metal film 12, and the other end thereof is connected to the metal film 9. Accordingly, the metal film 12 and the metal film 9 are electrically connected to each other via the plurality of vias V. In the lead portion 74, one end of each via V is connected to the metal film 13, and the other end thereof is connected to the metal film 9. Accordingly, the metal film 13 and the metal film 9 are electrically connected to each other via the plurality of vias V. The plurality of vias V may be constituted of solid metal members filling the inward sides of penetration holes formed in the lead frame 89 or may exhibit film shapes formed on inner side surfaces of penetration holes formed in the lead frame 89.

In the present modification example as well, similar to the foregoing embodiment, excellent workability of the base plate 2 can be maintained, and impedance matching can be favorably performed. Furthermore, in the present modification example, the lead frame 89 includes the plurality of vias V electrically connecting the metal film 9 and the plurality of metal films 10, 11, 12, and 13 to each other. In this case, even if the plurality of semiconductor elements 103 and 104 inside the semiconductor device 100B are electrically connected to the metal film 9 and one of the plurality of metal films 10, 11, 12, and 13 and an element outside the semiconductor device 100B is electrically connected to the metal film 9 and another one of the plurality of metal films 10, 11, 12, and 13, these elements may be electrically connected to each other. Therefore, the degree of freedom in design of the semiconductor device 100B and the degree of freedom in design of a circuit including the semiconductor device 100B are improved.

Second Modification Example

Figure 25:
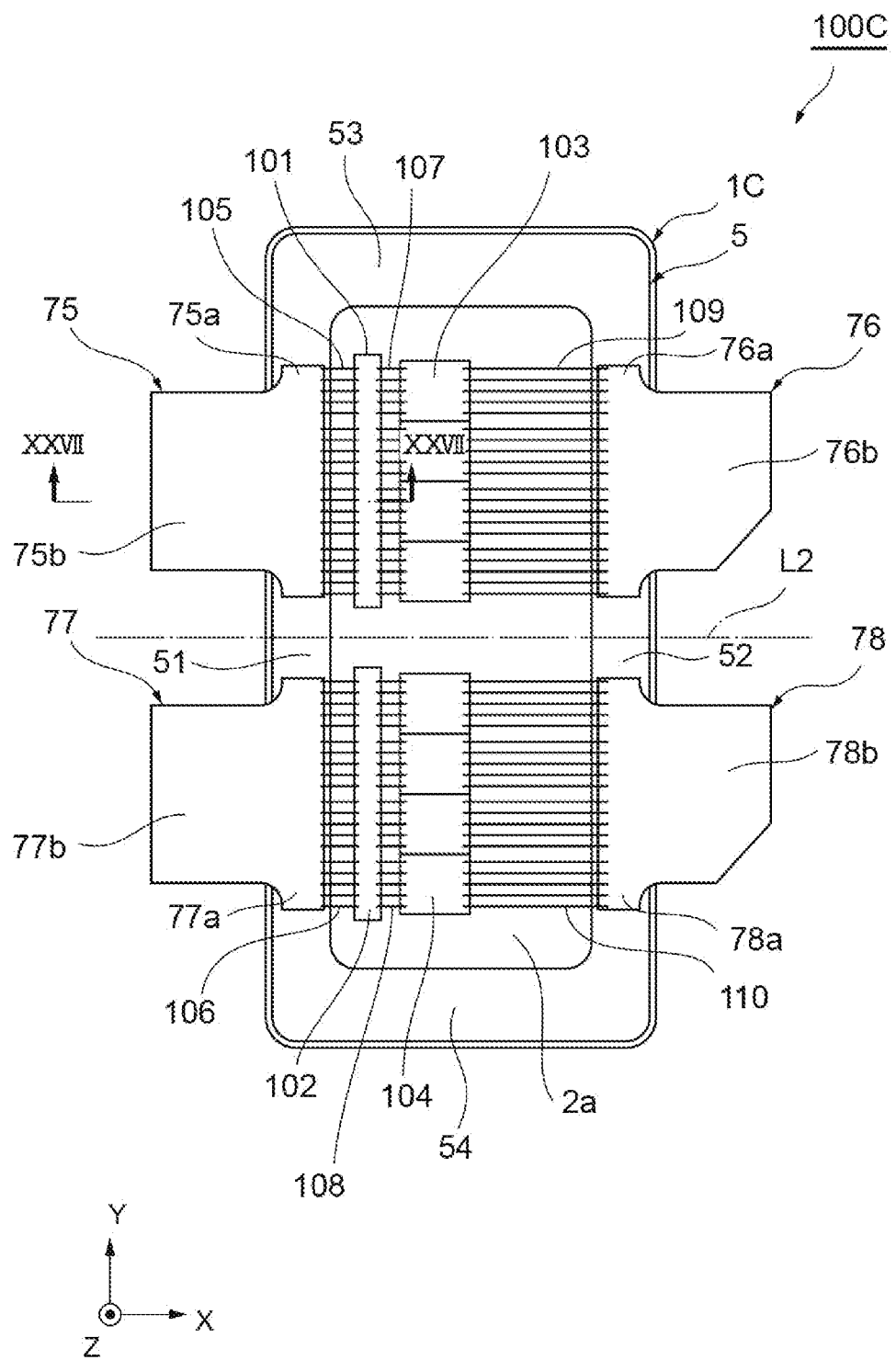
FIG. 25 is a plan view illustrating a package for a semiconductor device and a semiconductor device according to a second modification example.
Figure 26:
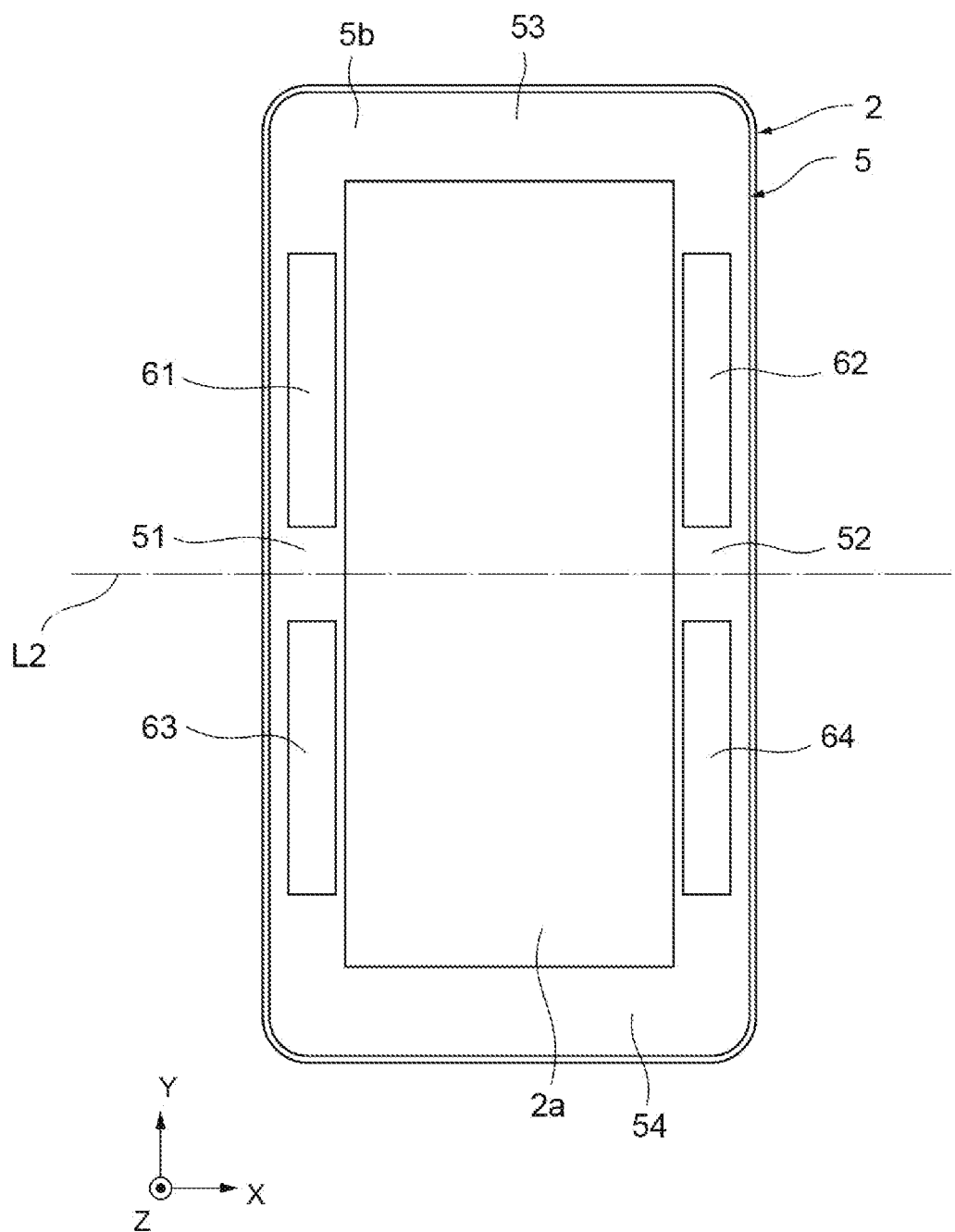
FIG. 26 is a plan view illustrating a constitution of the package in which lead portions are removed.
Figure 27:
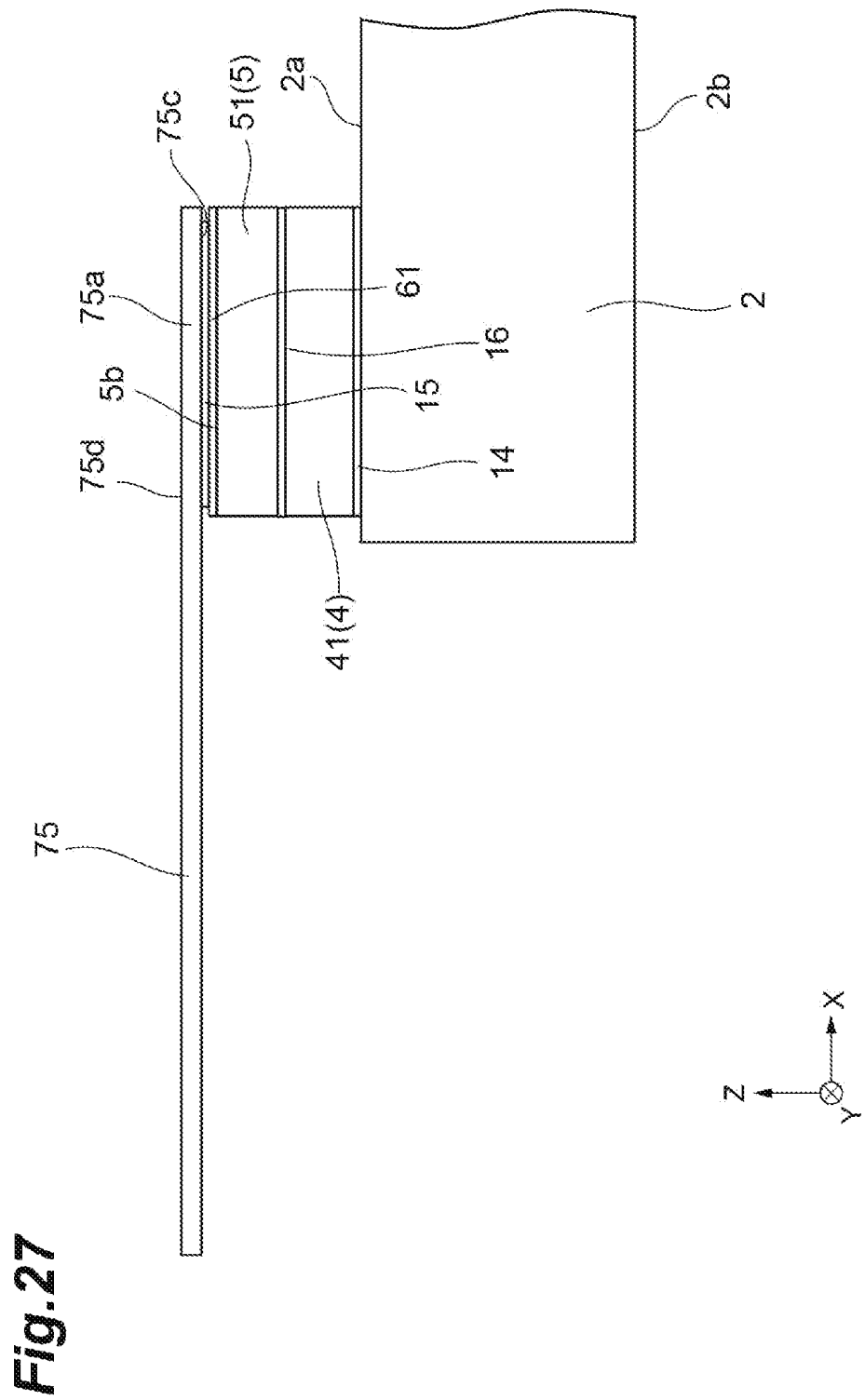
FIG. 27 is a view schematically illustrating a cross section along line XXVII-XXVII in FIG. 25.

FIG. 25 is a plan view illustrating a package 1C for a semiconductor device and a semiconductor device 100C according to a second modification example of the foregoing embodiment. In FIG. 25, illustration of a lid portion (lid) included in the package 1C is omitted. FIG. 26 is a plan view illustrating a constitution of the package 1C in which a plurality of lead portions 75, 76, 77, and 78 are removed. FIG. 27 schematically illustrates a cross section corresponding to line XXVII-XXVII in FIG. 25.

The package 1C and the semiconductor device 100C of the present modification example differ from the package 1A and the semiconductor device 100A of the foregoing embodiment in the following matters and coincide therewith in other matters. Hereinafter, description will be given with reference to FIGS. 25, 26, and 27.

As illustrated in FIG. 26, the package 1C includes metal films 61, 62, 63, and 64 (first metal films) in place of the metal film 6 of the foregoing embodiment. The metal film 61 is positioned in a region closer to the part 53 than a centerline L2 of the package 1C in the direction X on the top surface 5b of the part 51 of the second frame body 5. The metal film 62 is positioned in a region closer to the part 53 than the centerline L2 on the top surface 5b of the part 52 of the second frame body 5. The metal film 63 is positioned in a region closer to the part 54 than the centerline L2 on the top surface 5b of the part 51 of the second frame body 5. The metal film 64 is positioned in a region closer to the part 54 than the centerline L2 on the top surface 5b of the part 52 of the second frame body 5.

Each of the plurality of lead portions 75, 76, 77, and 78 includes a metal plate. As an example, each of the plurality of lead portions 75, 76, 77, and 78 is constituted of a metal plate. The plurality of lead portions 75, 76, 77, and 78 respectively have a plurality of base end portions 75a, 76a, 77a, and 78a. The plurality of lead portions 75, 76, 77, and 78 respectively have a plurality of protrusion portions 75b, 76b, 77b, and 78b. The plurality of base end portions 75a, 76a, 77a, and 78a are respectively disposed on the plurality of metal films 61, 62, 63, and 64. The plurality of protrusion portions 75b, 76b, 77b, and 78b respectively protrude from the plurality of base end portions 75a, 76a, 77a, and 78a toward the outward region of the package 1C in the direction X.

As illustrated in FIG. 27, the base end portion 75a of the lead portion 75 has a first main surface 75c facing the top surface 5b of the second frame body 5 and a second main surface 75d facing opposite to the first main surface 75c. The first main surface 75c of the base end portion 75a is conductively bonded to the metal film 61 with the second bonding material 15 interposed therebetween. Similar to the base end portion 75a, each of the plurality of base end portions 76a, 77a, and 78a of the plurality of lead portions 76, 77, and 78 also has a first main surface facing the top surface 5b of the second frame body 5 and a second main surface facing opposite to the first main surface. The first main surface of each of the base end portions 76a, 77a, and 78a is conductively bonded to the respective metal films 62, 63, and 64 with the second bonding material 15 interposed therebetween.

In the method for manufacturing the package 1C and the semiconductor device 100C of the present modification example, being different from the foregoing embodiment, the plurality of metal films 61, 62, 63, and 64 are formed in place of the metal film 6. In the method for manufacturing the package 1C and the semiconductor device 100C of the present modification example, being different from the foregoing embodiment, the plurality of lead portions 75, 76, 77, and 78 are respectively bonded to the plurality of metal films 61, 62, 63, and 64 in place of the lead portion 7 of the foregoing embodiment. Except for these matters, the method for manufacturing the package 1C and the semiconductor device 100C of the present modification example is similar to the manufacturing method of the foregoing embodiment.

In the present modification example as well, similar to the foregoing embodiment, excellent workability of the base plate 2 can be maintained, and impedance matching can be favorably performed. Furthermore, in the present modification example, the plurality of lead portions 75, 76, 77, and 78 are provided on the second frame body 5. The plurality of lead portions 75, 76, 77, and 78 respectively include the plurality of base end portions 75a, 76a, 77a, and 78a (metal plates). The plurality of base end portions 75a, 76a, 77a, and 78a are conductively bonded to the plurality of metal films 61, 62, 63, and 64, respectively. In this case, the external shapes of the lead portions 75, 76, 77, and 78 are easily formed by etching. Therefore, the package 1C and the semiconductor device 100C can be easily manufactured.

Third Modification Example

Figure 28:
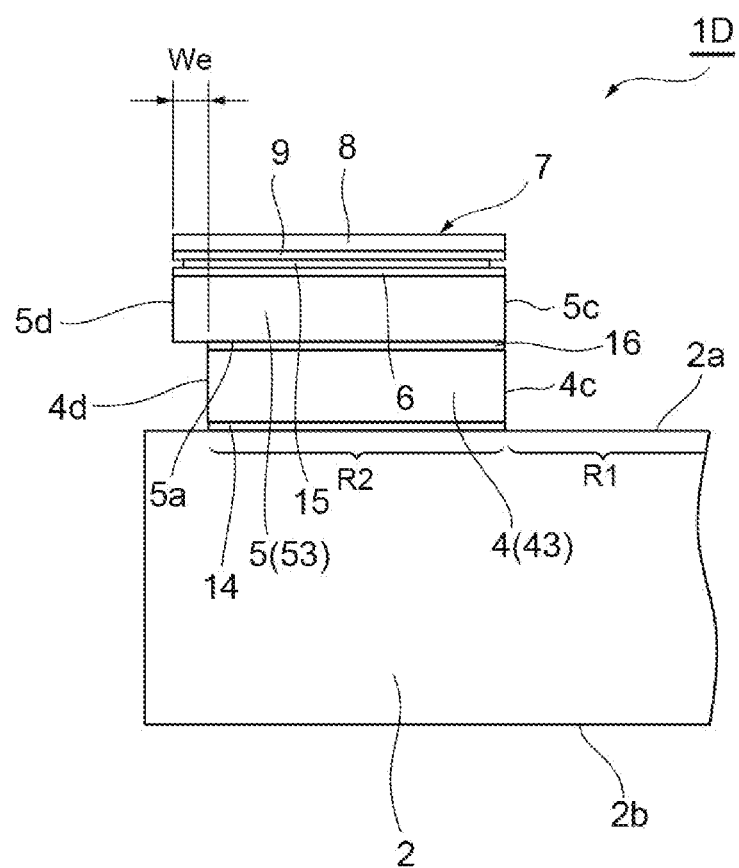
FIG. 28 is a view schematically illustrating a cross section of a package for a semiconductor device according to a third modification example.

FIG. 28 is a schematic view illustrating a partial cross section of a package 1D for a semiconductor device according to a third modification example of the foregoing embodiment. FIG. 28 illustrates a cross section corresponding to line III-III in FIG. 1. The package 1D of the present modification example differs from the package 1A of the foregoing embodiment in the following matters and coincides therewith in other matters.

In the present modification example, at least a part on the outer side surface 5d of the second frame body 5 protrudes to a region opposite to the first region R1 beyond the outer side surface 4d of the first frame body 4. Further, at least a part on the bottom surface 5a of the second frame body 5 is exposed to the outside of the package 1D. FIG. 28 illustrates an example in which the outer side surface 5d of the part 53 of the second frame body 5 protrudes beyond the outer side surface 4d of the part 43 of the first frame body 4. The outer side surface 5d of each of the parts 51, 52, and 54 of the second frame body 5 may also protrude beyond the outer side surface 4d of each of the parts 41, 42, and 44 of the first frame body 4. For example, a protrusion length We of the outer side surface 5d of the second frame body 5 is 50 μm or more and 500 μm or less, is more preferably 100 μm or more and 300 μm or less, and is 200 μm, for example.

When a semiconductor device and a different electronic component are mounted on a substrate, the different electronic component may erroneously come too close to the wall portion 3 of the semiconductor device. In the present modification example, when a different electronic component comes close to the wall portion 3, it is likely that the electronic component comes into contact with the second frame body 5 before the first frame body 4. Therefore, a short circuit between an electronic component and the first frame body 4 can be curbed. In the present modification example as well, operational effects similar to those of the first embodiment described above are exhibited, and thus the problems are resolved. In the present modification example, the inner side surface 5c of the second frame body 5 may be flush with the inner side surface 4c of the first frame body 4.

Fourth Modification Example

Figure 29:
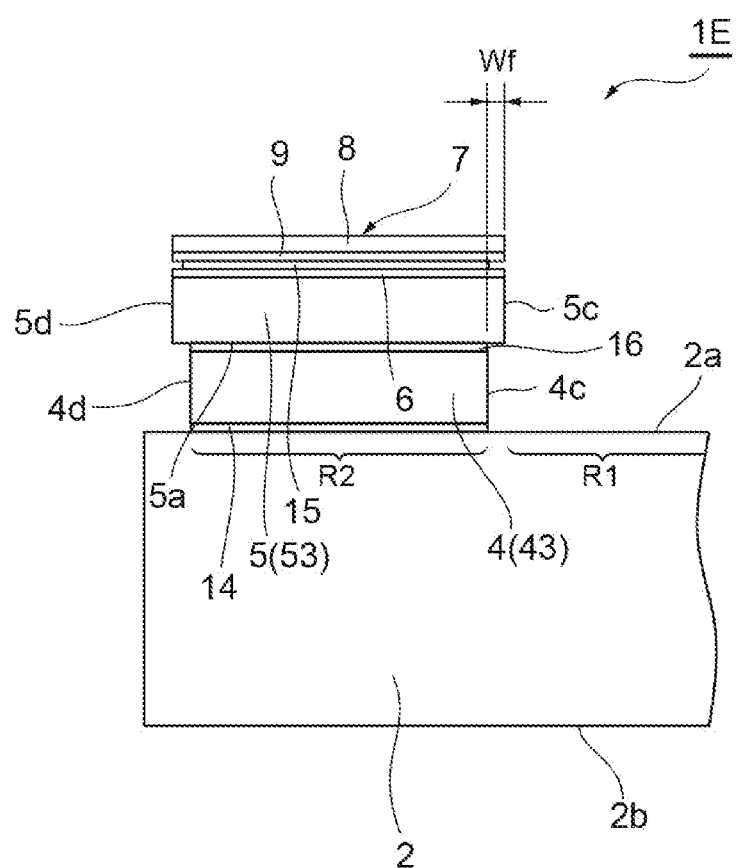
FIG. 29 is a view schematically illustrating a cross section of a package for a semiconductor device according to a fourth modification example.

FIG. 29 is a schematic view illustrating a partial cross section of a package 1E for a semiconductor device according to a fourth modification example of the foregoing embodiment. FIG. 29 illustrates a cross section corresponding to line III-III in FIG. 1. The package 1E of the present modification example differs from the package 1A of the foregoing embodiment in the following matters and coincides therewith in other matters.

In the present modification example, at least a part on the inner side surface 5c of the second frame body 5 protrudes toward the first region R1 beyond the inner side surface 4c of the first frame body 4. Further, at least a part on the bottom surface 5a of the second frame body 5 is exposed to the inside of the package 1E. FIG. 29 illustrates an example in which the inner side surface 5c of the part 53 of the second frame body 5 protrudes beyond the inner side surface 4c of the part 43 of the first frame body 4. The inner side surface 5c of each of the parts 51, 52, and 54 of the second frame body 5 may also protrude beyond the inner side surface 4c of each of the parts 41, 42, and 44 of the first frame body 4. For example, a protrusion length Wf of the inner side surface 5c of the second frame body 5 is 50 μm or more and 500 μm or less, is more preferably 100 μm or more and 300 μm or less, and is 200 μm, for example.

In the present modification example as well, similar to the third modification example, at least a part on the outer side surface 5d of the second frame body 5 may protrude to a region opposite to the first region R1 beyond the outer side surface 4d of the first frame body 4. Alternatively, the outer side surface 5d of the second frame body 5 may be flush with the outer side surface 4d of the first frame body 4.

When the semiconductor elements 103 and 104 are disposed inside a package of a semiconductor device, the semiconductor elements 103 and 104 may erroneously come too close to the wall portion 3. In the present modification example, when the semiconductor elements 103 and 104 come close to the wall portion 3, it is likely that the semiconductor elements 103 and 104 come into contact with the second frame body 5 before the first frame body 4. Therefore, a short circuit between the signal input electrodes (or the signal output electrodes) of the semiconductor elements 103 and 104 and the first frame body 4 can be curbed. In the present modification example as well, operational effects similar to those of the first embodiment described above are exhibited, and thus the problems are resolved.

The package for a semiconductor device and the semiconductor device according to the present disclosure are not limited to the exemplification of the embodiment and each of the modification examples described above, and various other modifications can be made. For example, each of the embodiments and each of the modification examples described above may be combined with each other in accordance with the required purpose and effect.

What is claimed is:

1. A package for a semiconductor device comprising:
a base plate having a first region and a second region surrounding the first region, the base plate comprising a metal;
a wall portion having a first frame body provided on the second region and a second frame body provided on the first frame body, the first frame body comprising a metal, the second frame body comprising a resin;
a first metal film provided on the second frame body; and
a lead portion conductively bonded to the first metal film,
wherein the first frame body is conductively bonded to the base plate,
wherein a thickness of the first frame body in a first direction that is a direction in which the first frame body and the second frame body are arranged is larger than a thickness of the first metal film in the first direction,
wherein the lead portion has:
a lead frame including a first main surface facing the second frame body and a second main surface facing opposite to the first main surface, the lead frame comprising a resin;
a second metal film provided on the first main surface and conductively bonded to the first metal film; and
a third metal film provided on the second main surface; and
wherein the lead frame includes a plurality of vias electrically connecting the second metal film and the third metal film to each other.

2. The package for a semiconductor device according to claim 1,
wherein the thickness of the first frame body in the first direction is 100 μm or more and 500 μm or less.

3. The package for a semiconductor device according to claim 1,
wherein the second frame body does not have a via electrically connected to the first frame body or the first metal film.

4. The package for a semiconductor device according to claim 1,
wherein an outer side surface of the second frame body protrudes to a region opposite to the first region beyond an outer side surface of the first frame body.

5. The package for a semiconductor device according to claim 1,
wherein an inner side surface of the second frame body protrudes toward the first region beyond an inner side surface of the first frame body.

6. The package for a semiconductor device according to claim 1,
wherein the base plate and the first frame body are conductively bonded to each other with a conductive bonding material interposed therebetween.

7. The package for a semiconductor device according to claim 1, wherein the first frame body and the second frame body are bonded to each other with an insulating adhesive or a resin adhesive interposed therebetween.

8. A semiconductor device comprising:
the package according to claim 1; and
a semiconductor element mounted inside the package,
wherein the lead portion is electrically connected to the semiconductor element via wiring inside the package.

\* \* \* \* \*